US011107399B2

(12) United States Patent
Yanase et al.

(10) Patent No.: US 11,107,399 B2
(45) Date of Patent: Aug. 31, 2021

(54) ORGANIC LIGHT-EMITTING DIODE DISPLAY DEVICE WITH PIXEL ARRAY

(71) Applicant: Tianma Japan, Ltd., Kanagawa (JP)

(72) Inventors: Jiro Yanase, Kanagawa (JP); Yojiro Matsueda, Kanagawa (JP); Yoshihiro Nonaka, Kanagawa (JP)

(73) Assignees: WUHAN TIANMA MICRO-ELECTRONICS CO., LTD., Wuhan (CN); TIANMA JAPAN, LTD., Kanagawa (JP)

( * ) Notice: Subject to any disclaimer, the term of this patent is extended or adjusted under 35 U.S.C. 154(b) by 0 days.

(21) Appl. No.: 16/523,300

(22) Filed: Jul. 26, 2019

(65) Prior Publication Data
US 2020/0035156 A1 Jan. 30, 2020

(30) Foreign Application Priority Data

Jul. 26, 2018 (JP) .............................. JP2018140655
Apr. 12, 2019 (JP) .............................. JP2019-076505

(51) Int. Cl.
G09G 3/3233 (2016.01)
G09G 3/20 (2006.01)
(Continued)

(52) U.S. Cl.
CPC ......... *G09G 3/3233* (2013.01); *G09G 3/2074* (2013.01); *H01L 27/3211* (2013.01);
(Continued)

(58) Field of Classification Search
CPC ............... G09G 3/3233; G09G 3/2074; G09G 2300/0439; G09G 2300/0426;
(Continued)

(56) References Cited

U.S. PATENT DOCUMENTS

| 2006/0077139 | A1* | 4/2006 | Kwon ................. | G09G 3/3283 345/76 |
| 2016/0148981 | A1* | 5/2016 | Matsueda ........... | H01L 27/3218 257/40 |
| 2017/0352312 | A1 | 12/2017 | Ebisuno et al. | |

FOREIGN PATENT DOCUMENTS

JP 06189320 A * 7/1994

OTHER PUBLICATIONS

Machine translation of JPH06189320a and copy of JPH06189320a (Year: 1994).*

* cited by examiner

*Primary Examiner* — Patrick N Edouard
*Assistant Examiner* — Joseph P Fox
(74) *Attorney, Agent, or Firm* — Nixon & Vanderhye

(57) ABSTRACT

A display device includes power lines, first driving transistors on a first side of each of the power lines, second driving transistors on a second side of each of the power lines, light-emitting elements of a first color, a second color and a third color. A first driving transistor of a first power line drives a light-emitting element of the first color. A second driving transistor of the first power line drives a light-emitting element of the second color. A first driving transistor of a second power line drives a light-emitting element of the third color. A second driving transistor of the second power line drives a light-emitting element of the second color. A first driving transistor of a third power line drives a light-emitting element of the first color. A second driving transistor of the third power line drives a light-emitting element of the third color.

19 Claims, 16 Drawing Sheets

COMPARATIVE EXAMPLE

(51) Int. Cl.
  *H01L 27/32* (2006.01)
  *H01L 51/50* (2006.01)
(52) U.S. Cl.
  CPC ...... *H01L 27/3276* (2013.01); *H01L 27/3262* (2013.01); *H01L 51/5012* (2013.01)
(58) Field of Classification Search
  CPC ........ G09G 2300/0465; H01L 27/3211; H01L 27/3276; H01L 51/5012; H01L 27/3262; H01L 27/3216; H01L 27/3218; H01L 27/3244; H01L 27/3248
  See application file for complete search history.

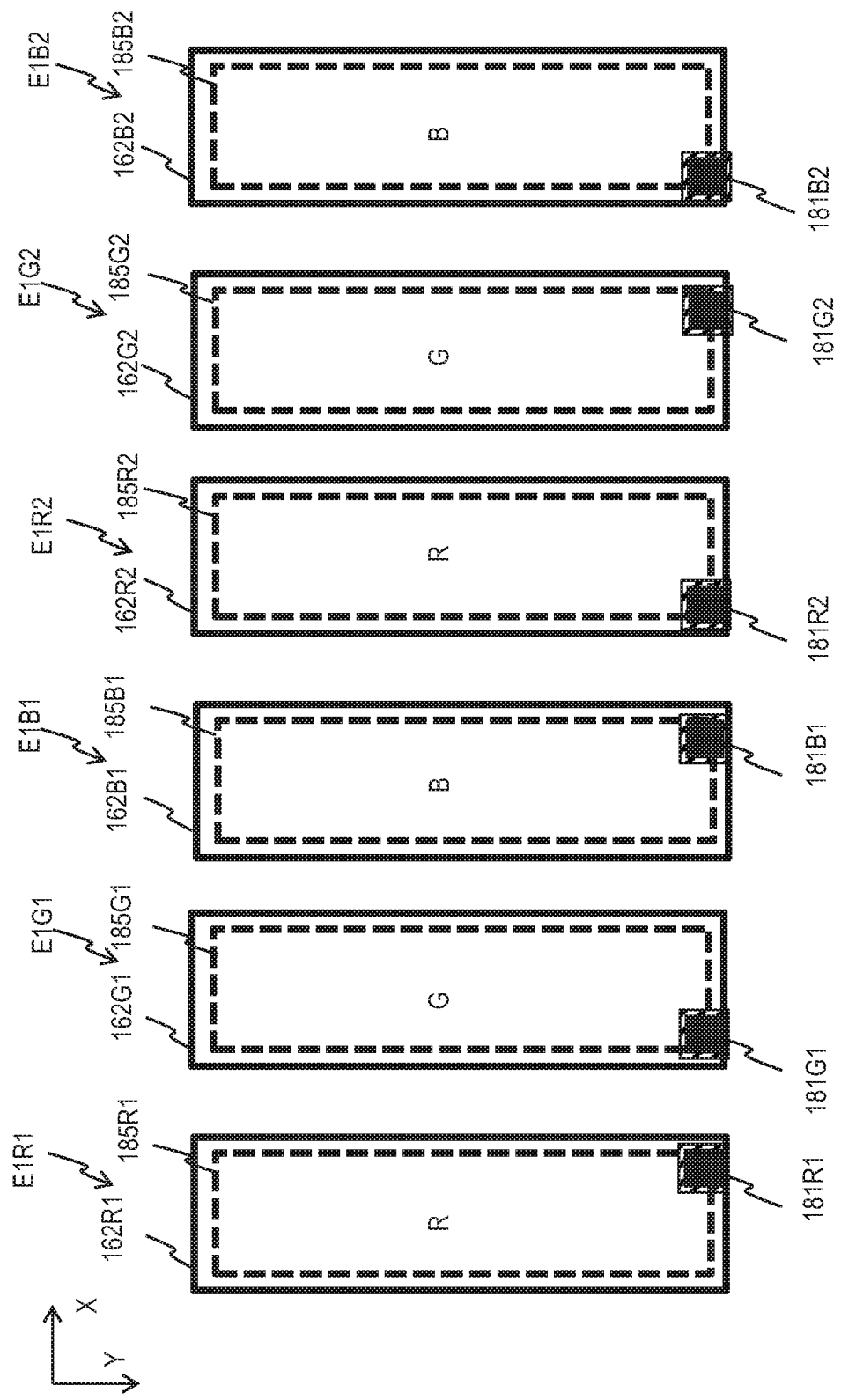
FIG. 4A COMPARATIVE EXAMPLE

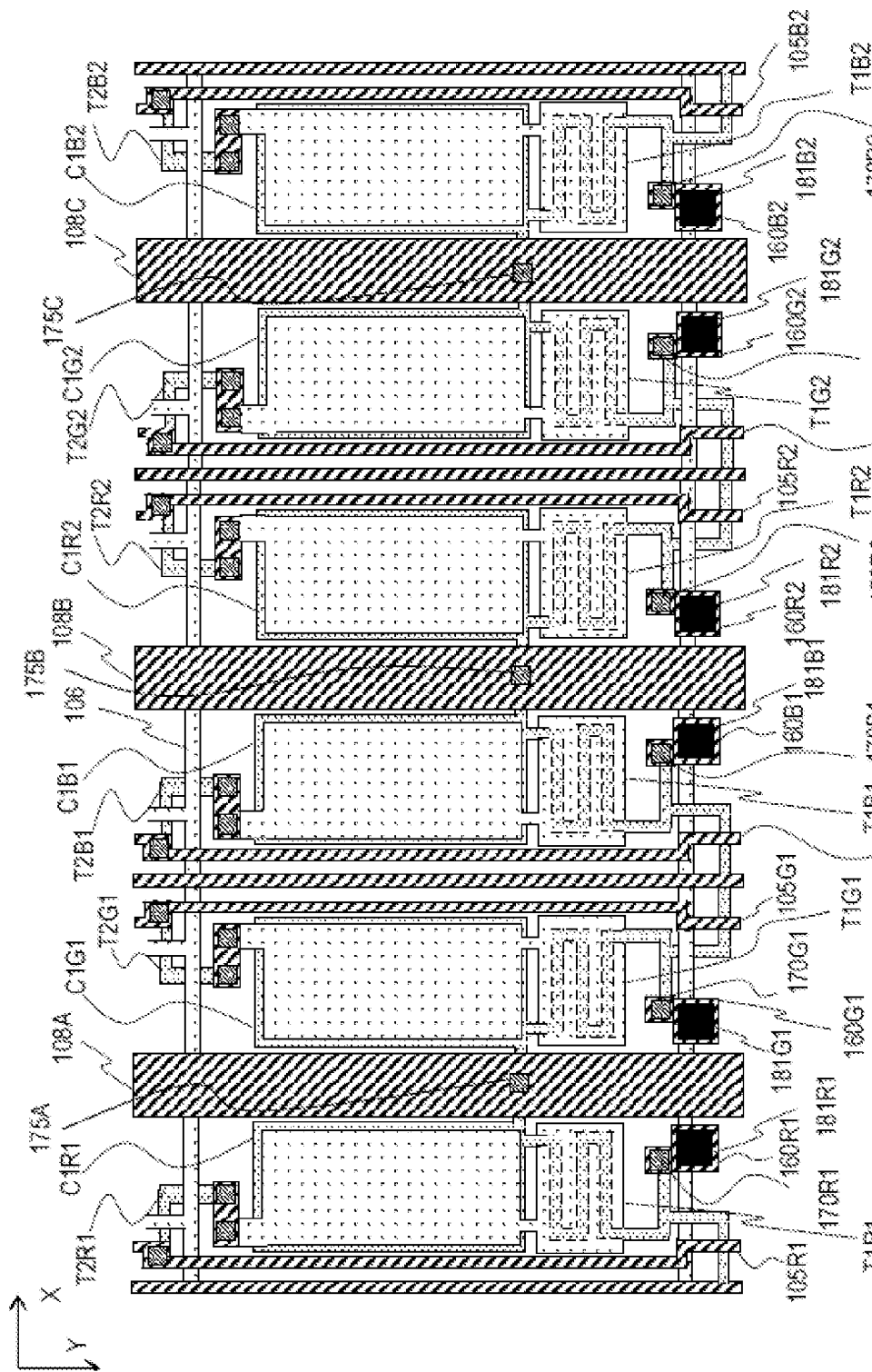
FIG. 4B COMPARATIVE EXAMPLE

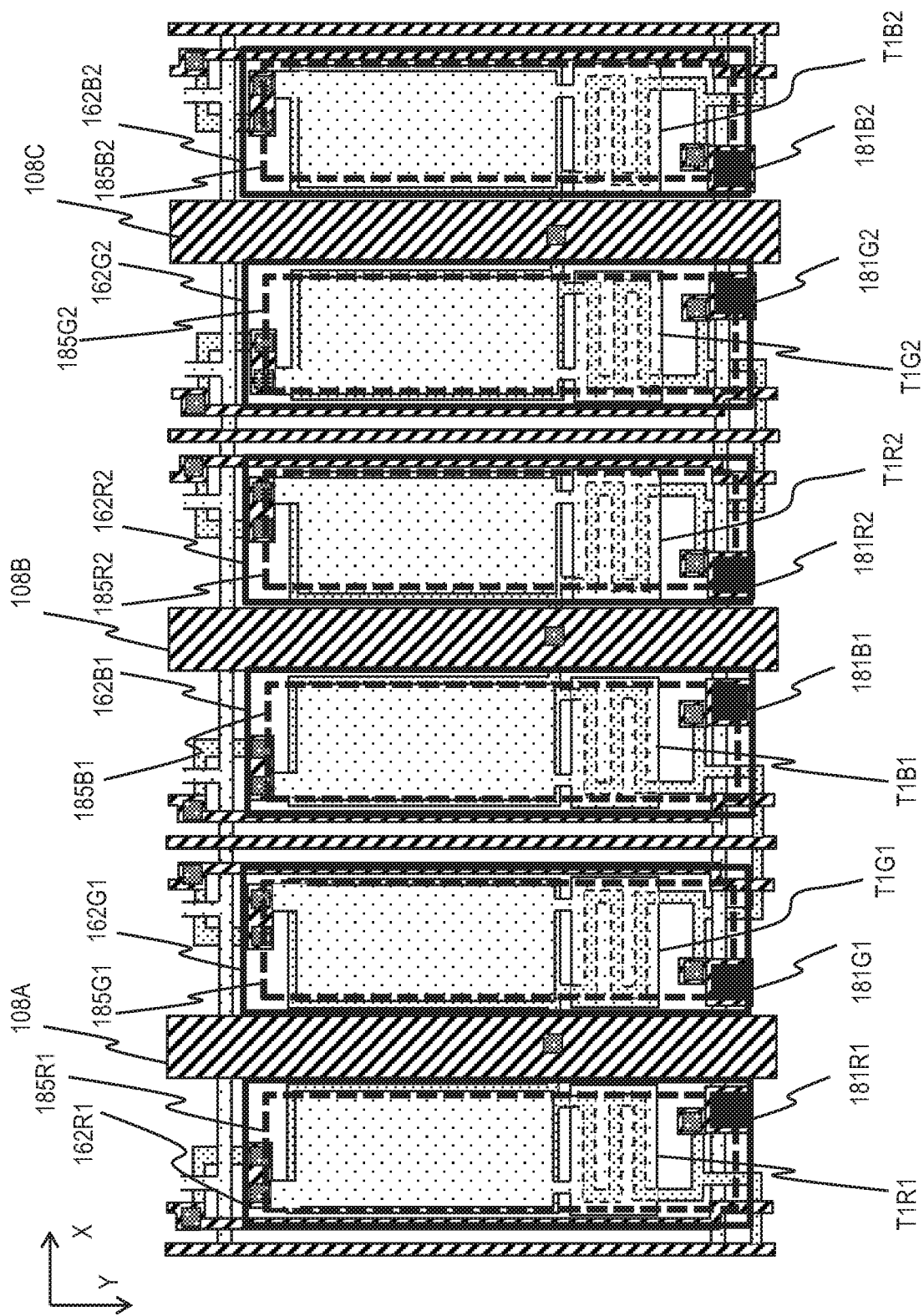
FIG. 4C COMPARATIVE EXAMPLE

ORGANIC LIGHT-EMITTING DIODE DISPLAY DEVICE WITH PIXEL ARRAY

CROSS-REFERENCE TO RELATED APPLICATIONS

This Non-provisional application claims priority under 35 U.S.C. § 119(a) on Patent Application No. 2018-140655 filed in Japan on Jul. 26, 2018 and Patent Application No. 2019-76505 filed in Japan on Apr. 12, 2019, the entire contents of which are hereby incorporated by reference.

BACKGROUND

This disclosure relates to a display device.

An organic light-emitting diode (OLED) element is a self-light-emitting element to be driven by electric current and therefore, it does not require backlight. In addition to this, the OLED display element has advantages to achieve low power consumption, wide viewing angle, and high contrast ratio; it is expected to contribute to development of flat panel display devices.

An active matrix type of OLED display device has a display region where a plurality of pixels are arrayed. Each pixel includes one or more subpixels. In the case where each pixel includes a plurality of subpixels, the subpixels in a pixel emit different colors of light. A subpixel includes a pixel circuit including a transistor for selecting the subpixel and a driving transistor for supplying electric current to the OLED element that produces display of the subpixel.

A single-color OLED display device has an array of pixels of a single color only; in contrast, a full-color OLED display device has an array of subpixels of three primary colors of red (R), green (G), and blue (B), for example. The trend for higher resolution in small-sized OLED panels to be mounted on devices such as a smartphone or a tablet computer has advanced downsizing of pixels. In the meanwhile, pixel circuits have been improved to attain higher functionality, which has resulted in increase of the number of elements in a pixel circuit and the area occupied by the elements.

As disclosed in US 2017/0352312 A, the wiring space can be reduced by sharing a power line between pixel circuits adjacent to each other. However, paying attention to the subpixel columns of the same color, striped display unevenness is frequently observed such that bright subpixel columns are alternate with dark subpixel columns when an image in a single color of the same gradation level is displayed.

SUMMARY

An aspect of this disclosure is a display device including: a plurality of power lines disposed to extend along a first axis and to be distant from one another along a second axis; a plurality of first driving transistors, each of which is disposed on a first side along the second axis of respective one of the plurality of power lines and provided with a power-supply potential from the respective power line; a plurality of second driving transistors, each of which is disposed on a second side along the second axis of respective one of the plurality of power lines and provided with a power-supply potential from the respective power line; and a plurality of light-emitting elements of a first color, a plurality of light-emitting elements of a second color, and a plurality of light-emitting elements of a third color. The plurality of power lines include a plurality of power line units disposed along the second axis. Each of the plurality of power line units consists of a first power line, a second power line adjacent to the first power line, and a third power line adjacent to the second power line. A first driving transistor of the first power line drives a first light-emitting element of the first color. A second driving transistor of the first power line drives a first light-emitting element of the second color. A first driving transistor of the second power line drives a first light-emitting element of the third color. A second driving transistor of the second power line drives a second light-emitting element of the second color. A first driving transistor of the third power line drives a second light-emitting element of the first color. A second driving transistor of the third power line drives a second light-emitting element of the third color.

It is to be understood that both the foregoing general description and the following detailed description are exemplary and explanatory and are not restrictive of this disclosure.

BRIEF DESCRIPTION OF THE DRAWINGS

FIG. 4A is a plan diagram for illustrating a layout of OLED elements of a comparative example;

FIG. 4B is a plan diagram for illustrating a layout of pixel circuits of the comparative example;

FIG. 4C is a plan diagram in which the OLED elements in FIG. 4A are superposed on the pixel circuits in FIG. 4B;

EMBODIMENTS

Hereinafter, embodiments of this disclosure will be described with reference to the accompanying drawings. It should be noted that the embodiments are merely examples to implement this disclosure and are not to limit the technical scope of this disclosure.

Overall Configuration

In the following, an organic light-emitting diode (OLED) display device is described as an example of a display device. The features of this disclosure are applicable to a display device other than the OLED display device, such as a micro LED display device or an inorganic electro-luminescence (EL) display device.

Figure 1:
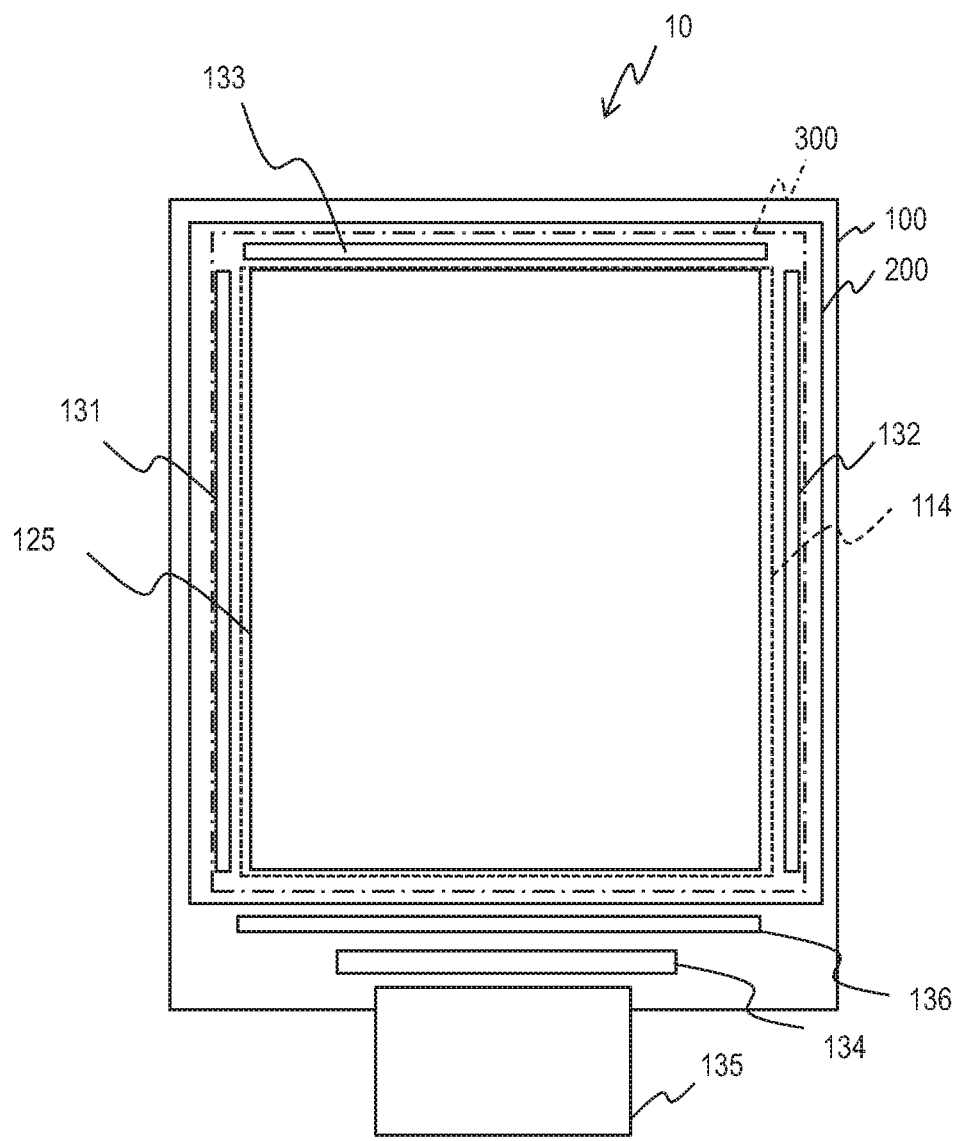
FIG. 1 schematically illustrates a configuration example of an OLED display device.

FIG. 1 schematically illustrates a configuration example of an OLED display device 10. The OLED display device 10 includes a thin film transistor (TFT) substrate 100 on which OLED elements are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, a protection circuit 133, a driver IC (driver circuit) 134, and a demultiplexer 136 are provided. The protection circuit 133 protects the elements from electrostatic discharge. The driver IC 134 is connected to the external devices via flexible printed circuits (FPC) 135.

The scanning driver 131 drives scanning lines on the TFT substrate 100. The emission driver 132 drives emission control lines to control the light emission periods of pixels. The driver IC 134 is mounted with an anisotropic conductive film (ACF), for example.

The driver IC 134 provides power and timing signals (control signals) to the scanning driver 131 and the emission driver 132 and further, provides power and a data signal to the demultiplexer 136.

The demultiplexer 136 outputs output of one pin of the driver IC 134 to d data lines in series (d is an integer more than 1). The demultiplexer 136 changes the output data line for the data signal from the driver IC 134 d times per scanning period to drive d times as many data lines as output pins of the driver IC 134. The data lines transmit control signals (data voltages) for controlling driving transistors T1.

Circuit Configuration

Figure 2A:
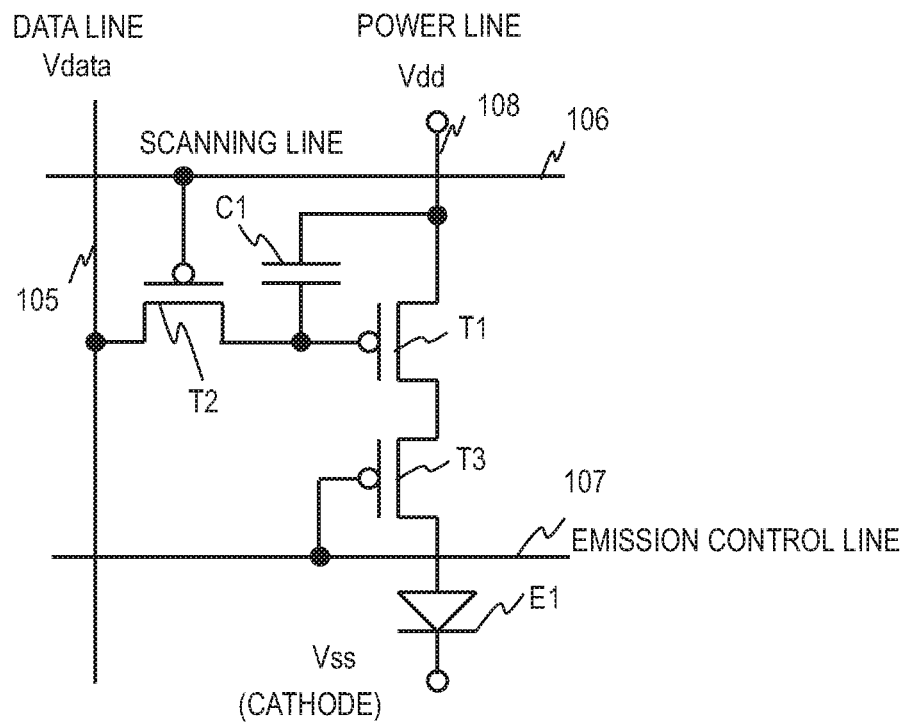
FIG. 2A illustrates a configuration example of a pixel circuit.

A plurality of pixel circuits are formed on the substrate 100 to control light emission of individual subpixels. FIG. 2A illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs.

The selection transistor T2 is a switch for selecting the sub-pixel. The selection transistor T2 is a p-channel TFT and its gate terminal is connected with a scanning line 106. The source terminal of the selection transistor T2 is connected with a data line 105. The drain terminal of the selection transistor T2 is connected with the gate terminal of the driving transistor T1.

The driving transistor T1 is a transistor for driving the OLED element E1. The driving transistor T1 is a p-channel TFT and its gate terminal is connected with the drain terminal of the selection transistor T2. The source terminal of the driving transistor T1 is connected with a power line (Vdd) 108. The drain terminal of the driving transistor T1 is connected with the source terminal of the emission transistor T3. The storage capacitor C1 is provided between the gate terminal and the source terminal of the driving transistor T1.

The emission transistor T3 is a switch for controlling supply/stop of the driving current to the OLED element E1. The emission transistor T3 is a p-channel TFT and its gate terminal is connected with an emission control line 107. The source terminal of the emission transistor T3 is connected with the drain terminal of the driving transistor T1. The drain terminal of the emission transistor T3 is connected with the OLED element E1.

Next, operation of the pixel circuit is described. The scanning driver 131 outputs a selection pulse to the scanning line 106 to turn on the transistor T2. The data voltage (control signal) supplied from the driver IC 134 through the data line 105 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 132 outputs a control signal to the emission control line 107 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3.

Figure 2B:
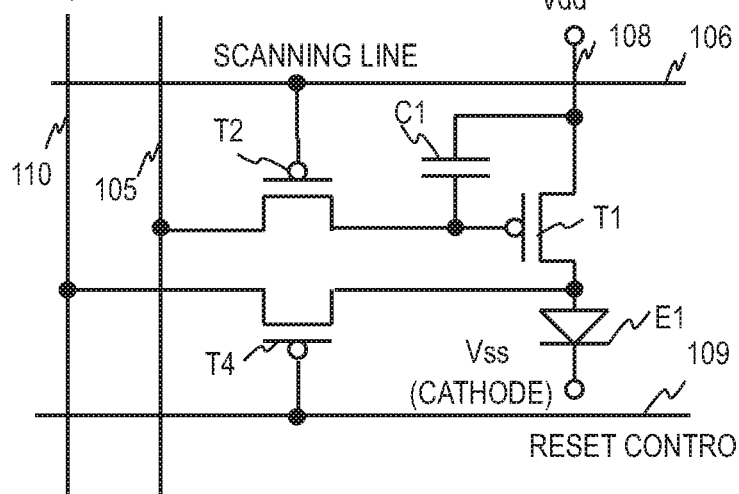
FIG. 2B illustrates another configuration example of a pixel circuit.

FIG. 2B illustrates another configuration example of a pixel circuit. This pixel circuit includes a reset transistor T4 in place of the emission transistor T3 in FIG. 2A. The reset transistor T4 controls the electric connection between a reference voltage supply line 110 and the anode of the OLED element E1. This control is performed in accordance with a reset control signal supplied from the reset control line 109 to the gate of the reset transistor T4.

The reset transistor T4 can be used for various purposes. For example, the reset transistor T4 can be used to reset the anode electrode of the OLED element E1 once to a sufficiently low voltage that is lower than the black signal level to prevent crosstalk caused by leak current between OLED elements E1.

The reset transistor T4 can also be used to measure a characteristic of the driving transistor T1. For example, the voltage-current characteristic of the driving transistor T1 can be accurately measured by measuring the current flowing from the power line (Vdd) 108 to the reference voltage supply line (Vref) 110 under the bias conditions selected so that the driving transistor T1 will operate in the saturated region and the reset transistor T4 will operate in the linear region. If the differences in voltage-current characteristic among the driving transistors T1 for individual subpixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 110 when the driving transistor T1 is off and the reset transistor T4 is operating in the linear region. In the case where the OLED element E1 is deteriorated because of long-term use, for example, if the deterioration is compensated for by generating a data signal at an external circuit, the display device can have a long life spun.

The circuit configurations in FIGS. 2A and 2B are examples; the pixel circuit may have a different circuit configuration. Although the pixel circuits in FIGS. 2A and 2B include p-channel TFTs, the pixel circuit may employ n-channel TFTs. Pixel circuits described above are provided to prevent impairment of the image quality by compensating for variations in threshold voltage among the driving transistors, for example. The technical means described in this specification to eliminate the characteristics differences among the transistors reduces the display unevenness that cannot be sufficiently reduced by the pixel circuits.

Structure of Pixel

Figure 2C:
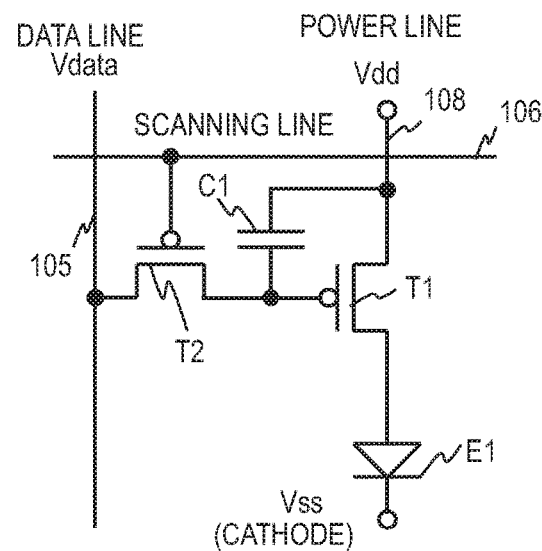
FIG. 2C illustrates still another configuration example of a pixel circuit.

Hereinafter, examples of the layout of pixel circuits are described. The configuration example of a pixel circuit illustrated in FIG. 2C is used for convenience of explanation. The pixel circuit in FIG. 2C has a configuration in which the emission transistor and the emission control line are omitted from the pixel circuit illustrated in FIG. 2A. The following description is applicable to other pixel circuit configurations like those illustrated in FIGS. 2A and 2B.

The pixel circuits in FIGS. 2A to 2C have configurations such that a power line is directly connected with the driving transistor. However, the pixel circuit may have a light-emission control transistor between the power line and the driving transistor. The light emission control transistor is enabled during the period to light the OLED element and is disabled during the period not to light the OLED element to prevent unintended light emission. That is to say, it is satisfactory if the power line is electrically connectable to the driving transistor and further, if the storage capacitor is electrically connectable to the gate of the driving transistor even though it is not connected directly.

Figure 3:
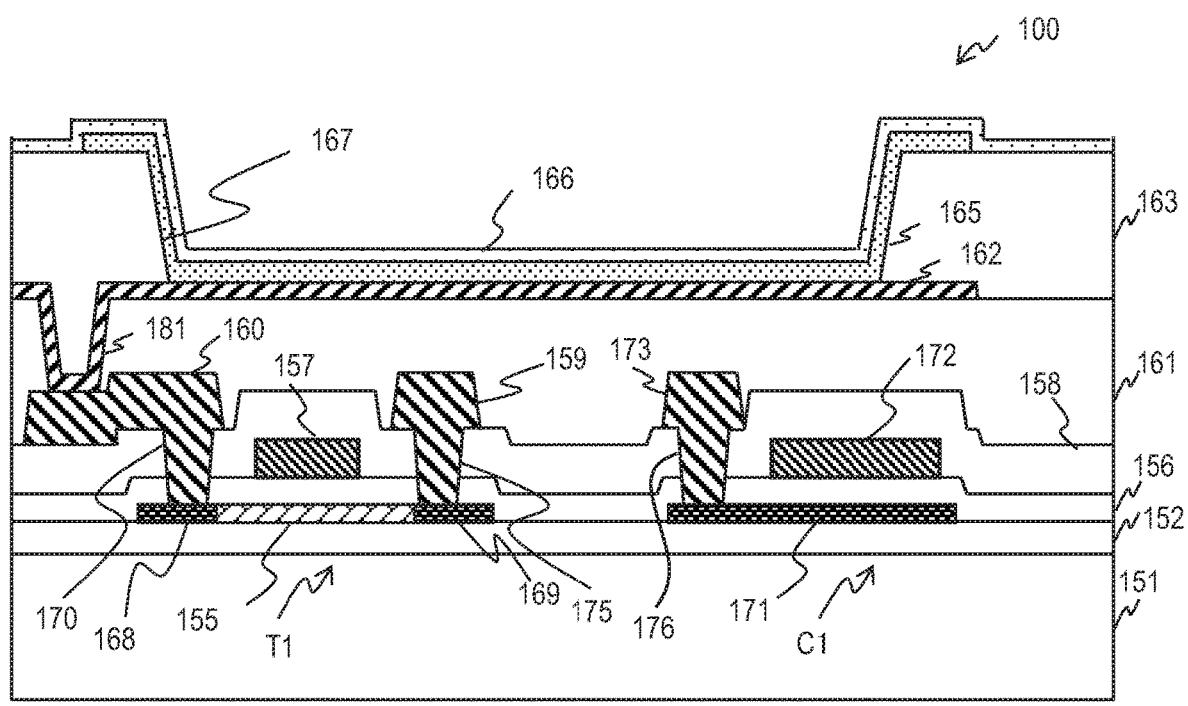
FIG. 3 schematically illustrates a part of a cross-sectional structure of a pixel circuit for a subpixel.

FIG. 3 schematically illustrates a part of a cross-sectional structure of the pixel circuit for a subpixel. A sub-pixel displays one of the colors of red, green, and blue. A red sub-pixel, a green sub-pixel, and a blue sub-pixel constitute one main pixel. The combination of colors can be different from red, green, and blue. A subpixel is the light-emitting region of an OLED element. FIG. 3 schematically illustrates the structures of the driving transistor T1, the storage capacitor C1, and the OLED element E1 in the pixel circuit illustrated in FIG. 2C.

In the following description, the definitions of top and bottom correspond to the top and the bottom of the drawing. The OLED display device 10 includes an insulating substrate 151 and a structural encapsulation unit opposed to the insulating substrate 151. The insulating substrate 151 and the elements provided thereon constitute a TFT substrate 100. An example of the structural encapsulation unit is a flexible or inflexible encapsulation substrate 200. The structural encapsulation unit can be a thin film encapsulation (TFE) structure.

The OLED display device 10 includes lower electrodes (for example, anode electrodes 162), upper electrodes (for example, cathode electrodes 166), and organic light-emitting films 165 disposed between the insulating substrate 151 and the structural encapsulation unit.

The organic light-emitting films 165 are provided between the cathode electrodes 166 and the anode electrodes 162. One organic light-emitting film 165 is disposed on one anode electrode 162. In the example of FIG. 3, the cathode electrode 166 of one subpixel is a part of an unseparated conductor film. The pixel circuit controls the electric current to be supplied to the anode electrode 162.

FIG. 3 schematically illustrates an example of a top-emission pixel structure. The top-emission pixel structure is configured in such a manner that a cathode electrode 166 common to a plurality of pixels is provided on the light emission side (the upper side of the drawing). The cathode electrode 166 has a shape that fully covers the entire display region 125. In the top-emission pixel structure, the anode electrodes 162 have light reflectivity and the cathode electrode 166 has light transmissivity. Hence, a configuration to transmit light coming from the organic light-emitting films 165 toward the structural encapsulation unit is attained.

Compared to a bottom-emission pixel structure configured to extract light from the insulating substrate 151, the top-emission type does not need a light transmissive region within a pixel region to extract light. For this reason, the top-emission type has high flexibility in laying out pixel circuits. For example, the light-emitting unit can be provided above the pixel circuits or lines.

The bottom-emission pixel structure has a transparent anode electrode and a reflective cathode electrode to transmit light to the external through the insulating substrate 151. The pixel circuit layout of this disclosure is also applicable to the bottom-emission pixel structure.

A subpixel of a full-color OLED display device usually displays one of the colors of red, green, and blue. A red subpixel, a green subpixel, and a blue subpixel constitute one main pixel. A pixel circuit including a plurality of thin film transistors controls light emission of an OLED element associated therewith. An OLED element is composed of an anode electrode as a lower electrode, an organic light-emitting film, and a cathode electrode as an upper electrode.

The insulating substrate 151 is made of glass or resin, for example, and is flexible or inflexible. A silicon layer is provided above the insulating substrate 151 with a first insulating film 152 interposed therebetween. The first insulating film 152 is made of silicon nitride, for example.

The silicon layer is made of amorphous silicon or polysilicon. The silicon layer includes a channel 155 that determines the transistor characteristics of the TFT at the place where a gate electrode 157 is to be formed. The silicon layer further includes an electrode 171 of the storage capacitor C1. The electrode 171 is doped with high-concentration impurities.

At both ends of the channel 155, a drain region 168 and a source region 169 are provided. The drain region 168 and the source region 169 are doped with high-concentration impurities for electrical connection with a wiring layer thereabove. Lightly doped drains (LDDs) doped with low-concentration impurities can be provided between the channel 155 and the drain region 168 and between the channel 155 and the source region 169. FIG. 3 omits the LDDs to avoid complexity.

A gate insulating film 156 is provided above the silicon layer. A gate electrode 157 is provided above the channel 155 with the gate insulating film 156 interposed therebetween. Another electrode 172 is provided above the electrode 171 with the gate insulating film 156 interposed therebetween. The gate electrode 157 and the electrode 172 are formed on the same layer; for example, the gate electrode 157 and the electrode 172 are unseparated within one pixel circuit.

The metal layer including the gate electrode 157 and the electrode 172 further includes lines such as scanning lines 106 and emission control lines. The metal layer may be a single layer made of one material selected from a group consisting of Mo, W, Nb, MoW, MoNb, Al, Nd, Ti, Cu, a Cu alloy, an Al alloy, Ag, and an Ag alloy. Alternatively, the metal layer may be a laminated layer to reduce the wiring resistance. The laminated layer has a multi-layer structure including two or more layers each made of a low-resistive material selected from a group consisting of Mo, Cu, Al, and Ag.

A source electrode 159, a drain electrode 160, and a contact 173 are provided above an interlayer insulating film 158. The source electrode 159, the drain electrode 160, and the contact 173 are formed of a metal having a high melting point or an alloy of such a metal. The source electrode 159 and the drain electrode 160 are connected with the source region 169 and the drain region 168 of the silicon layer through contact holes 175 and 170 provided in the interlayer insulating film 158 and the gate insulating film 156.

The contact 173 connects the electrode 171 and a power line 108. The contact 173 is connected with the electrode 171 through a contact hole 176 in the interlayer insulating film 158. The metal layer including the source electrode 159, the drain electrode 160, and the contact 173 further includes lines such as data lines 105 and power lines 108. This metal layer is formed by depositing and patterning a conductive film like a Ti/Al/Ti film.

Over the source electrode 159, the drain electrode 160, and the contact 173, an insulative planarization film 161 is provided. Above the insulative planarization film 161, an anode electrode 162 is provided. The anode electrode 162 is connected with the drain electrode 160 through a contact hole 181 in the planarization film 161. The TFTs of a pixel circuit are formed below the anode electrode 162.

The anode electrode 162 includes three layers of a transparent film made of ITO, IZO, ZnO, $In_2O_3$, or the like, a reflective film made of a metal such as Ag, Mg, Al, Pt, Pd, Au, Ni, Nd, Ir, or Cr, or an alloy of such a metal, and another transparent film as mentioned above.

Above the anode electrode 162, an insulative pixel defining layer (PDL) 163 is provided to isolate an OLED element. The OLED element is formed in an opening 167 of the pixel defining layer 163. Above the anode electrode 162, an organic light-emitting film 165 is provided. The organic light-emitting film 165 is attached on the pixel defining layer 163 in the opening 167 of the pixel defining layer 163 and its periphery. An example of the organic light-emitting film 165 consists of a hole injection layer, a hole transport layer, a light emitting layer, an electron transport layer, and an electron injection layer in this order from the bottom. The laminate structure of the organic light-emitting film 165 is determined depending on the design.

A cathode electrode 166 is provided over the organic light-emitting film 165. The cathode electrode 166 is a light-transmissive electrode. The cathode electrode 166 transmits all or part of the visible light coming from the organic light-emitting film 165. The laminated film of the anode electrode 162, the organic light-emitting film 165, and the cathode electrode 166 formed in an opening 167 of the pixel defining layer 163 corresponds to an OLED element. A not-shown cap layer may be provided over the cathode electrode 166.

The cathode electrode 166 is made of a metal such as Al or Mg or an alloy of such a metal. If the resistance of the cathode electrode 166 is so high to impair the uniformity of the luminance of the emitted light, an auxiliary electrode layer made of a material for a transparent electrode, such as ITO, IZO, ZnO, or $In_2O_3$ may be added.

Layout of Pixel Circuits

Hereinafter, some examples of the layout of OLED elements and pixel circuits for driving the OLED elements are described. First, a comparative example is described with reference to FIGS. 4A, 4B, and 4C. FIG. 4A is a plan diagram for illustrating a layout of OLED elements of a comparative example. FIG. 4B is a plan diagram for illustrating a layout of pixel circuits of the comparative example. FIG. 4C is a plan diagram in which the OLED elements in FIG. 4A are superposed on the pixel circuits in FIG. 4B.

FIG. 4A illustrates six OLED elements disposed along the X-axis (second axis). The X-axis extends horizontally in FIG. 4A. FIG. 4A shows the anode electrodes and the light-emitting regions of the OLED elements. The OLED elements are cyclically disposed in the order of a red OLED element, a green OLED element, and a blue OLED element from the left to the right of FIG. 4A. Specifically, an OLED element E1R1, an OLED element E1G1, an OLED element E1B1, an OLED element E1R2, an OLED element E1G2, and an OLED element E1B2 are disposed from the left to the right.

The alphabets R, G, and B in the reference signs represent red, green, and blue, respectively. A red OLED element, a green OLED element, and a blue OLED element (the light-emitting regions thereof) adjacent to one another constitute one main pixel. OLED elements are disposed in the same manner in the other rows. In other words, the same color of OLED elements (subpixels) are disposed along the Y-axis (first axis) that is perpendicular to the X-axis. Such a pixel arrangement is called matrix arrangement. The row direction is a direction along the X-axis and the column direction is a direction along the Y-axis.

The OLED element E1R1 includes an anode electrode 162R1 and a light-emitting region 185R1. The OLED element E1G1 includes an anode electrode 162G1 and a light-emitting region 185G1. The OLED element E1B1 includes an anode electrode 162B1 and a light-emitting region 185B1. The OLED element E1R2 includes an anode electrode 162R2 and a light-emitting region 185R2. The OLED element E1G2 includes an anode electrode 162G2 and a light-emitting region 185G2. The OLED element E1B2 includes an anode electrode 162B2 and a light-emitting region 185B2.

In the example of FIG. 4A, the anode electrodes have the identical rectangular shapes and the light-emitting regions have the identical rectangular shapes. The shapes of the anode electrodes and the light-emitting regions depend on the design. The light-emitting region of each OLED element is included in the region of the anode electrode, when viewed planarly.

As described with reference to FIG. 3, an anode electrode is connected with a driving transistor through a contact hole. In FIG. 4A, the anode electrodes 162R1, 162G1, 162B1, 162R2, 162G2, and 162B2 are connected with driving transistors through contact holes 181R1, 181G1, 181B1, 181R2, 181G2, and 181B2, respectively.

FIG. 4B illustrates six pixel circuits disposed along the X-axis. The pixel circuits are to control driving of the OLED elements E1R1, E1G1, E1B1, E1R2, E1G2, and E1B2 illustrated in FIG. 4A. FIG. 4B shows only partial configurations of the pixel circuits.

A data line 105R1, a power line 108A, a data line 105G1, a data line 105B1, a power line 108B, a data line 105R2, a data line 105G2, a power line 108C, and a data line 105B2 are disposed from the left to the right (along the X-axis) in FIG. 4B. The data lines and the power lines extend vertically (along the Y-axis) in FIG. 4B.

In FIG. 4B, the pixel circuit for the OLED element E1R1 is disposed between the data line 105R1 and the power line 108A extending along the Y-axis. The pixel circuit includes a driving transistor T1R1, a selection transistor T2R1, and a storage capacitor C1R1. The channel of the driving transistor T1R1 is indicated by a dashed line behind the gate electrode.

The driving transistor T1R1 and the storage capacitor C1R1 are connected with the power line 108A through a contact hole 175A. The channel of the driving transistor T1R1 is connected with the drain electrode 160R1 through a contact hole 170R1. The drain electrode 160R1 is connected with the anode electrode 162R1 (not shown in FIG. 4B) through a contact hole 181R1. The driving transistor T1R1 is controlled in accordance with a signal from the data line 105R1 to control the current from the power line 108A to the OLED element E1R1.

The pixel circuit for the OLED element E1G1 is disposed between the power line 108A and the data line 105G1 extending along the Y-axis. The pixel circuit includes a driving transistor T1G1, a selection transistor T2G1, and a storage capacitor C1G1.

The driving transistor T1G1 and the storage capacitor C1G1 are connected with the power line 108A through the contact hole 175A. The channel of the driving transistor T1G1 is connected with the drain electrode 160G1 through a contact hole 170G1. The drain electrode 160G1 is connected with the anode electrode 162G1 (not shown in FIG. 4B) through a contact hole 181G1. The driving transistor T1G1 is controlled in accordance with a signal from the data line 105G1 to control the current from the power line 108A to the OLED element E1G1.

The pixel circuit for the OLED element E1B1 is disposed between the data line 105B1 and the power line 108B extending along the Y-axis. The pixel circuit includes a driving transistor T1B1, a selection transistor T2B1, and a storage capacitor C1B1.

The driving transistor T1B1 and the storage capacitor C1B1 are connected with the power line 108B through a contact hole 175B. The channel of the driving transistor T1B1 is connected with the drain electrode 160B1 through a contact hole 170B1. The drain electrode 160B1 is connected with the anode electrode 162B1 (not shown in FIG. 4B) through a contact hole 181B1. The driving transistor T1B1 is controlled in accordance with a signal from the data line 105B1 to control the current from the power line 108B to the OLED element E1B1.

The pixel circuit for the OLED element E1R2 is disposed between the power line 108B and the data line 105R2 extending along the Y-axis. The pixel circuit includes a driving transistor T1R2, a selection transistor T2R2, and a storage capacitor C1R2.

The driving transistor T1R2 and the storage capacitor C1R2 are connected with the power line 108B through the contact hole 175B. The channel of the driving transistor T1R2 is connected with the drain electrode 160R2 through a contact hole 170R2. The drain electrode 160R2 is connected with the anode electrode 162R2 (not shown in FIG. 4B) through a contact hole 181R2. The driving transistor T1R2 is controlled in accordance with a signal from the data line 105R2 to control the current from the power line 108B to the OLED element E1R2.

The pixel circuit for the OLED element E1G2 is disposed between the data line 105G2 and the power line 108C extending along the Y-axis. The pixel circuit includes a driving transistor T1G2, a selection transistor T2G2, and a storage capacitor C1G2.

The driving transistor T1G2 and the storage capacitor C1G2 are connected with the power line 108C through a contact hole 175C. The channel of the driving transistor T1G2 is connected with the drain electrode 160G2 through a contact hole 170G2. The drain electrode 160G2 is connected with the anode electrode 162G2 (not shown in FIG. 4B) through a contact hole 181G2. The driving transistor T1G2 is controlled in accordance with a signal from the data line 105G2 to control the current from the power line 108C to the OLED element E1G2.

The pixel circuit for the OLED element E1B2 is disposed between the power line 108C and the data line 105B2 extending along the Y-axis. The pixel circuit includes a driving transistor T1B2, a selection transistor T2B2, and a storage capacitor C1B2.

The driving transistor T1B2 and the storage capacitor C1B2 are connected with the power line 108C through the contact hole 175C. The channel of the driving transistor T1B2 is connected with the drain electrode 160B2 through a contact hole 170B2. The drain electrode 160B2 is connected with the anode electrode 162B2 (not shown in FIG. 4B) through a contact hole 181B2. The driving transistor T1B2 is controlled in accordance with a signal from the data line 105B2 to control the current from the power line 108C to the OLED element E1B2.

FIG. 4C illustrates six OLED elements disposed along the X-axis and the pixel circuits for controlling driving of the OLED elements. The anode electrodes 162R1, 162G1, 162B1, 162R2, 162G2, and 162B2 are connected with the driving transistors T1R1, T1G1, T1B1, T1R2, T1G2, and T1B2 through the contact holes 181R1, 181G1, 181B1, 181R2, 181G2, and 181B2, respectively.

In the layout example of FIG. 4C, the pixel circuits on both sides of a power line share the power line and have symmetric patterns about the power line. Sharing one power line between two pixel circuits leads to reduction in wiring space and increase in circuit density. As a result of sharing one power line between two pixel circuits, the driving transistors and the power lines have the following positional relations.

The driving transistor T1R1 is located on the left of the power line 108A connected therewith. In contrast, the driving transistor T1R2 is located on the right of the power line 108B connected therewith. The driving transistor T1G1 is located on the right of the power line 108A connected therewith. In contrast, the driving transistor T1G2 is located on the left of the power line 108C connected therewith. The driving transistor T1B1 is located on the left of the power line 108B connected therewith. In contrast, the driving transistor T1B2 is located on the right of the power line 108C connected therewith.

In fabricating a TFT substrate 100, misalignment of photomasks could occur. When misalignment occurs along the X-axis, namely toward either the right or the left of FIG. 4C, the gate electrode of a driving transistor will be located closer to or more distant from the power line connected therewith. As a result, the parasitic capacitance between the gate electrode of the driving transistor and the power line changes. If the gate electrode of the driving transistor gets close to the power line, the parasitic capacitance increases; if the gate electrode of the driving transistor gets away from the power line, the parasitic capacitance decreases.

When misalignment occurs, the pixel circuits in the odd-numbered columns and the pixel circuits in the even-numbered columns are dislocated in the opposite directions with respect to the power lines connected therewith. For example, assume that the gate electrodes of the driving transistors are misaligned leftward in FIG. 4C. The parasitic capacitances of the driving transistors T1R1, T1B1, and T1G2 located on the left of the power lines 108A, 108B, and 108C, respectively, decrease. Conversely, the parasitic capacitances of the driving transistors T1G1, T1R2, and T1B2 located on the right of the power lines 108A, 108B, and 108C, respectively, increase.

Driving transistors having different parasitic capacitances provide different driving currents in response to the same gate signal. In the example of FIG. 4C, misalignment causes the driving transistors T1R1 and T1R2 for red OLED elements to be dislocated in the opposite directions. In similar, the driving transistors T1G1 and T1G2 for green OLED elements are dislocated in the opposite directions, so are the driving transistors T1B1 and T1B2 for blue OLED elements.

For this reason, one of two subpixels of the same color adjacent to each other increases its luminance and the other decreases its luminance in response to the same data signal. Accordingly, when the whole display region 125 displays an image in a single color at the same scale value, striped unevenness can be observed such that bright subpixel columns and dark subpixel columns appear alternately.

Figure 5A:
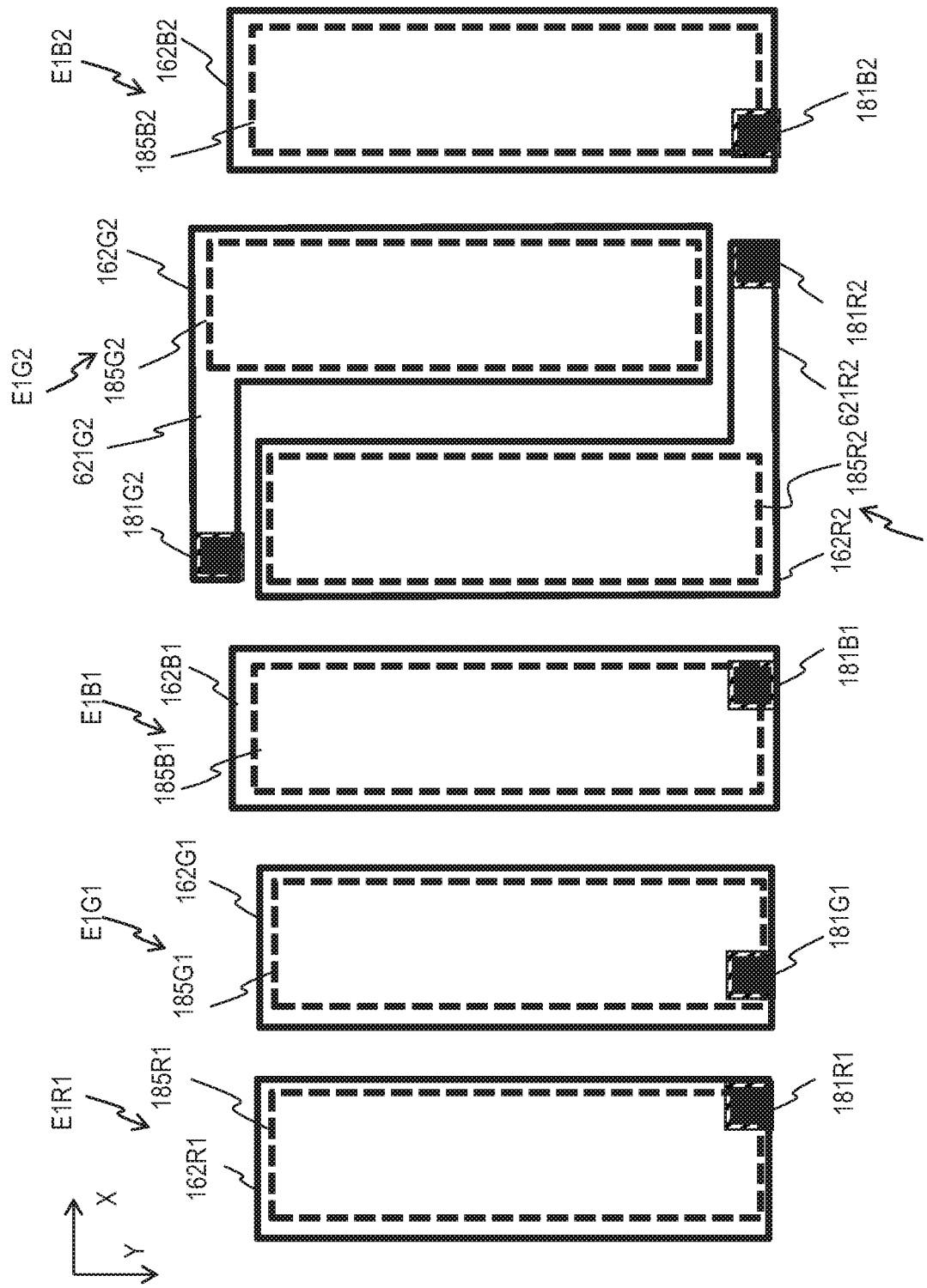
FIG. 5A is a plan diagram for illustrating a layout of OLED elements of this disclosure.
Figure 5B:
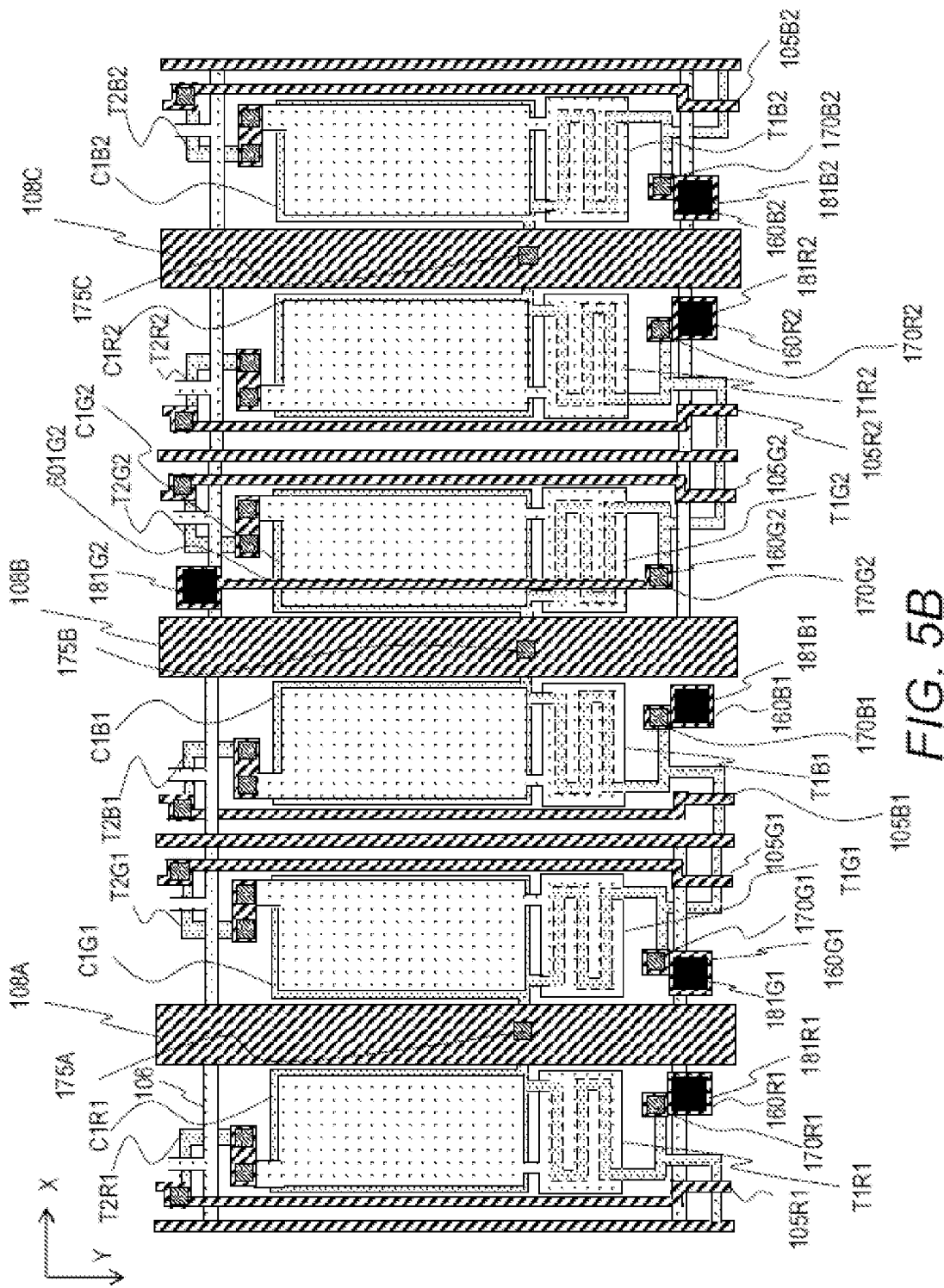
FIG. 5B is a plan diagram for illustrating a layout of pixel circuits of this disclosure.
Figure 5C:
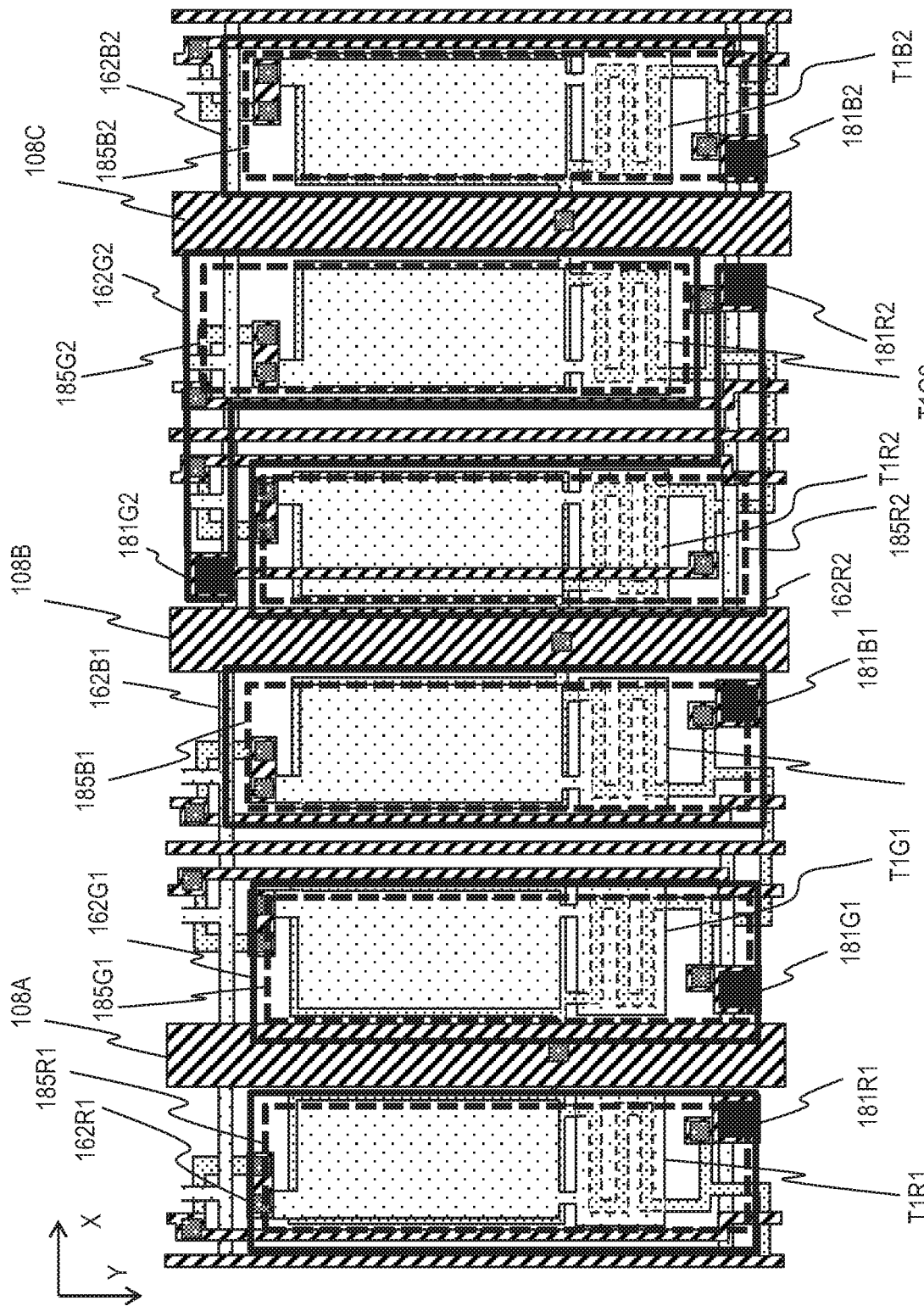
FIG. 5C is a plan diagram in which the OLED elements in FIG. 5A are superposed on the pixel circuits in FIG. 5B.

Hereinafter, the layout of pixel circuits and OLED elements of this disclosure is described. The layout of this disclosure prevents or reduces the impairment of the display quality caused by misalignment. An example of the layout of this disclosure is described with reference to FIGS. 5A, 5B, and 5C. FIG. 5A is a plan diagram for illustrating a layout of OLED elements of this disclosure. FIG. 5B is a plan diagram for illustrating a layout of pixel circuits of this disclosure. FIG. 5C is a plan diagram in which the pixel circuits in FIG. 5B are superposed on the OLED elements in FIG. 5A.

FIG. 5A illustrates six OLED elements disposed along the X-axis. FIG. 5A shows the anode electrodes and the light-emitting regions of the OLED elements. The OLED elements are cyclically disposed in the order of a red OLED element, a green OLED element, and a blue OLED element from the left to the right of FIG. 5A. Specifically, an OLED element E1R1, an OLED element E1G1, an OLED element E1B1, an OLED element E1R2, an OLED element E1G2, and an OLED element E1B2 are disposed from the left to the right. A red OLED element, a green OLED element, and a blue OLED element are disposed cyclically. The order of color can be different from this example.

A red OLED element, a green OLED element, and a blue OLED element (the light-emitting regions thereof) adjacent to one another constitute one main pixel. OLED elements are disposed in the same manner in the other rows. In other words, the same color of OLED elements (subpixels) are disposed along the Y-axis.

The OLED element E1R1 includes an anode electrode 162R1 and a light-emitting region 185R1. The OLED element E1G1 includes an anode electrode 162G1 and a light-emitting region 185G1. The OLED element E1B1 includes an anode electrode 162B1 and a light-emitting region 185B1. The OLED element E1R2 includes an anode electrode 162R2 and a light-emitting region 185R2. The OLED element E1G2 includes an anode electrode 162G2 and a light-emitting region 185G2. The OLED element E1B2 includes an anode electrode 162B2 and a light-emitting region 185B2.

The light-emitting region of each OLED element is included in the region of the anode electrode, when viewed planarly. In the example of FIG. 5A, the red light-emitting regions and the green light-emitting regions have identical rectangular shapes and the blue light-emitting regions have rectangular shapes a little larger than the red and green light-emitting regions. The light-emitting regions can have the identical shapes or different shapes among the colors. Although the light-emitting regions in FIG. 5A have rectangular shapes, the shapes of the light-emitting regions depend on the design.

The anode electrodes 162R1, 162G1, 162B1, 162R2, 162G2, and 162B2 are connected with driving transistors through contact holes 181R1, 181G1, 181B1, 181R2, 181G2, and 181B2, respectively.

In the example of FIG. 5A, the anode electrodes 162R1 and 162G1 have identical rectangular shapes. The anode electrodes 162B1 and 162B2 have identical rectangular shapes but they are a little larger than the anode electrodes 162R1 and 162G1. The anode electrode 162R2 has a shape different from the shape of the anode electrode 162R1.

Specifically, the anode electrode 162R2 has an arm (first arm) 621R2 extending toward one side along the X-axis (toward the right in FIG. 5A) on the first end along the Y-axis (the lower end in FIG. 5A). The contact hole 181R2 of the anode electrode 162R2 is provided at the tip of the arm 621R2.

The anode electrode 162G2 has an arm (second arm) 621G2 extending toward the other side along the X-axis (toward the left in FIG. 5A) on the second end along the Y-axis (the upper end in FIG. 5A). The contact hole 181G2 of the anode electrode 162G2 is provided at the tip of the arm 621G2.

The anode electrodes 162R2 and 162G2 are adjacent to each other and respectively have the arm 621R2 and the arm 621G2 on the opposite ends along the Y-axis. The arm 621R2 and the arm 621G2 extend in the opposite directions along the X-axis. As will be described later, the anode electrode 162R2 is connected with the pixel circuit covered with the anode electrode 162G2 when viewed planarly and the anode electrode 162G2 is connected with the pixel circuit covered with the anode electrode 162R2 when viewed planarly.

FIG. 5B illustrates six pixel circuits disposed along the X-axis. The pixel circuits are to control driving of the OLED elements E1R1, E1G1, E1B1, E1R2, E1G2, and E1B2 illustrated in FIG. 5A. FIG. 5B shows only partial configurations of the pixel circuits.

A data line 105R1, a power line 108A, a data line 105G1, a data line 105B1, a power line 108B, a data line 105G2, a data line 105R2, a power line 108C, and a data line 105B2 are disposed from the left to the right in FIG. 5B. The data lines and the power lines extend along the Y-axis. The power lines 108A, 108B, and 108C constitute a power line unit.

In FIG. 5B, the pixel circuit for the OLED element E1R1 is disposed between the data line 105R1 and the power line 108A extending along the Y-axis. The pixel circuit includes a driving transistor T1R1, a selection transistor T2R1, and a storage capacitor C1R1. The selection transistor T2R1, the storage capacitor C1R1, and the driving transistor T1R1 are disposed in this order from the top toward the bottom (along the Y-axis) in FIG. 5B.

The channel of the driving transistor T1R1 is indicated by a dashed line behind the gate electrode. The driving transistor T1R1 and the storage capacitor C1R1 are connected with the power line 108A through a contact hole 175A. The channel of the driving transistor T1R1 is connected with the drain electrode 160R1 through a contact hole 170R1. The drain electrode 160R1 is connected with the anode electrode 162R1 (not shown in FIG. 5B) through a contact hole 181R1. The driving transistor T1R1 is controlled in accordance with a signal from the data line 105R1 to control the current from the power line 108A to the OLED element E1R1.

The pixel circuit for the OLED element E1G1 is disposed between the power line 108A and the data line 105G1 extending along the Y-axis. The pixel circuit includes a driving transistor T1G1, a selection transistor T2G1, and a storage capacitor C1G1. The selection transistor T2G1, the storage capacitor C1G1, and the driving transistor T1G1 are disposed in this order from the top toward the bottom (along the Y-axis) in FIG. 5B.

The driving transistor T1G1 and the storage capacitor C1G1 are connected with the power line 108A through the contact hole 175A. The channel of the driving transistor T1G1 is connected with the drain electrode 160G1 through a contact hole 170G1. The drain electrode 160G1 is connected with the anode electrode 162G1 (not shown in FIG. 5B) through a contact hole 181G1. The driving transistor T1G1 is controlled in accordance with a signal from the data line 105G1 to control the current from the power line 108A to the OLED element E1G1.

The pixel circuit for the OLED element E1B1 is disposed between the data line 105B1 and the power line 108B extending along the Y-axis. The pixel circuit includes a driving transistor T1B1, a selection transistor T2B1, and a storage capacitor C1B1. The selection transistor T2B1, the storage capacitor C1B1, and the driving transistor T1B1 are disposed in this order from the top toward the bottom (along the Y-axis) in FIG. 5B.

The driving transistor T1B1 and the storage capacitor C1B1 are connected with the power line 108B through a contact hole 175B. The channel of the driving transistor T1B1 is connected with the drain electrode 160B1 through a contact hole 170B1. The drain electrode 160B1 is connected with the anode electrode 162B1 (not shown in FIG. 5B) through a contact hole 181B1. The driving transistor T1B1 is controlled in accordance with a signal from the data line 105B1 to control the current from the power line 108B to the OLED element E1B1.

The pixel circuit for the OLED element E1G2 is disposed between the power line 108B and the data line 105G2 extending along the Y-axis. The pixel circuit includes a driving transistor T1G2, a selection transistor T2G2, and a storage capacitor C1G2. The selection transistor T2G2, the storage capacitor C1G2, and the driving transistor T1G2 are disposed in this order from the top toward the bottom (along the Y-axis) in FIG. 5B.

The driving transistor T1G2 and the storage capacitor C1G2 are connected with the power line 108B through the contact hole 175B. The channel of the driving transistor T1G2 is connected with the drain electrode 160G2 through a contact hole 170G2. An anode line 601G2 extends from the drain electrode 160G2 toward the top (along the Y-axis) in FIG. 5B.

The line 601G2 is unseparated from the drain electrode 160G2 and is on the same metal layer. The line 601G2 is connected with the anode electrode 162G2 (not shown in FIG. 5B) through a contact hole 181G2 at the opposite end to the drain electrode 160G2.

The contact hole 181G2 is provided between the selection transistor T2G2 and the power line 108B. The storage capacitor C1G2 is provided between the contact hole 181G2 and the driving transistor T1G2. The anode electrode 162G2 and the driving transistor T1G2 are controlled in accordance with a signal from the data line 105G2 to control the current from the power line 108B to the OLED element E1G2.

The pixel circuit for the OLED element E1R2 is disposed between the data line 105R2 and the power line 108C extending along the Y-axis. The pixel circuit includes a driving transistor T1R2, a selection transistor T2R2, and a storage capacitor C1R2. The selection transistor T2R2, the storage capacitor C1R2, and the driving transistor T1R2 are disposed in this order from the top toward the bottom (along the Y-axis) in FIG. 5B.

The driving transistor T1R2 and the storage capacitor C1R2 are connected with the power line 108C through a contact hole 175C. The channel of the driving transistor T1R2 is connected with the drain electrode 160R2 through a contact hole 170R2. The drain electrode 160R2 is connected with the anode electrode 162R2 (not shown in FIG. 5B) through a contact hole 181R2. The driving transistor T1R2 is controlled in accordance with a signal from the data line 105R2 to control the current from the power line 108C to the OLED element E1R2.

The pixel circuit for the OLED element E1B2 is disposed between the power line 108C and the data line 105B2 extending along the Y-axis. The pixel circuit includes a driving transistor T1B2, a selection transistor T2B2, and a storage capacitor C1B2. The selection transistor T2B2, the storage capacitor C1B2, and the driving transistor T1B2 are disposed in this order from the top toward the bottom (along the Y-axis) in FIG. 5B.

The driving transistor T1B2 and the storage capacitor C1B2 are connected with the power line 108C through the contact hole 175C. The channel of the driving transistor T1B2 is connected with the drain electrode 160B2 through a contact hole 170B2. The drain electrode 160B2 is connected with the anode electrode 162B2 (not shown in FIG. 5B) through a contact hole 181B2. The driving transistor T1B2 is controlled in accordance with a signal from the data line 105B2 to control the current from the power line 108C to the OLED element E1B2.

FIG. 5C illustrates six OLED elements disposed along the X-axis and the pixel circuits for controlling driving of the OLED elements. The arm 621R2 of the anode electrode 162R2 extends toward the power line 108C. The arm 621G2 of the anode electrode 162G2 extends toward the power line 108B.

The anode electrodes 162R1, 162G1, 162B1, 162R2, 162G2, and 162B2 are connected with the driving transistors T1R1, T1G1, T1B1, T1R2, T1G2, and T1B2 through the contact holes 181R1, 181G1, 181B1, 181R2, 181G2, and 181B2, respectively.

In the layout example of FIG. 5C, the pixel circuits on both sides of a power line share the power line. The driving transistors on both sides of a power line have symmetric patterns about the power line. Except for the anode line 601G2 and the contact hole 181G2 for the anode electrode 162G2 in the pixel circuit for the OLED element E1G2, each pair of pixel circuits on both sides of a power line have symmetric patterns about the power line.

As illustrated in FIG. 5C, the order of the OLED elements E1R2 and E1G2 is opposite to the order of the pixel circuits for the OLED elements E1R2 and E1G2 along the X-axis. When viewed planarly, the OLED element E1R2 overlaps the pixel circuit for the OLED element E1G2 and the OLED element E1G2 overlaps the pixel circuit for the OLED element E1R2.

The arms 621R2 and 621G2 and the anode line 601G2 enable appropriate connection of the anode electrodes 162R2 and 162G2 to the driving transistors T1R2 and T1G2 with small effect on the layout of the other elements.

Sharing one power line between two pixel circuits leads to reduction in wiring space and increase in circuit density. In the layout illustrated in FIG. 5C, the driving transistors and the power lines have the following positional relations.

The driving transistors T1R1 and T1R2 are disposed on the left (on one side along the X-axis) of the power lines 108A and 108C, respectively, connected therewith. The driving transistors T1G1 and T1G2 are disposed on the right (on the other side along the X-axis) of the power lines 108A and 108B, respectively, connected therewith. As noted from this description, the driving transistors T1R1 and T1R2 for red OLED elements are disposed on the left of the power lines connected therewith and the driving transistors T1G1 and T1G2 for green OLED elements are disposed on the right of the power lines connected therewith.

For this reason, even if misalignment occurs along the X-axis, namely toward either the right or the left of FIG. 5C, both of the gate electrodes of the driving transistors T1R1 and T1R2 for red OLED elements are dislocated in the same direction with respect to the power line connected therewith, namely get close to or away from the power line. Accordingly, differences in characteristics between the driving transistors caused by the misalignment and further, the resulting difference in luminance between the red subpixels can be eliminated.

In similar, even if misalignment toward the right or the left of FIG. 5C occurs, both of the gate electrodes of the driving transistors T1G1 and T1G2 for green OLED elements are dislocated in the same direction with respect to the power line connected therewith, namely get close to or away from the power line. Accordingly, differences in characteristics between the driving transistors caused by the misalignment and further, the resulting difference in luminance between the green subpixels can be eliminated.

In contrast, the driving transistor T1B1 for a blue OLED element is disposed on the left of the power line 108B connected therewith and the driving transistor T1B2 for the other blue OLED element is disposed on the right of the power line 108C connected therewith. Accordingly, misalignment could cause differences in characteristics between the driving transistors and generate a difference in luminance between the blue subpixels. However, green has the highest relative visibility and blue has the lowest. For this reason, people perceive of the difference in luminance about green light or red light more delicately than blue light. The layout of this embodiment eliminates the differences in luminance among red subpixels and among green subpixels to minimize the impairment of the display quality.

It is preferable that, like in the foregoing example, red and green having high relative visibility be selected and each pair of driving transistors for the same color of subpixels be disposed on the same side with respect to the power line connected therewith. However, the selected colors can be red and blue or green and blue. Each pair of driving transistors for the same color of subpixels are disposed on the same side with respect to the power line connected therewith. Any one of these layouts reduces the impairment of display quality caused by misalignment, compared to the comparative example described with reference to FIGS. 4A to 4C. The combination of colors of subpixels can be different from the combination of red, green, and blue.

In the layout of this example, two pixel circuits share one power line. Accordingly, a wide power line can be employed without increasing the layout area of a pixel circuit. A wide power line has low electric resistance; it prevents occurrence of IR drop. As a result, impairment of display quality caused by IR drop can be prevented. Particularly, IR drop tends to occur around the center of the screen because the pixel circuits around the center of the screen are distant from the power supply. If such IR drop is prevented, impairment of the display quality in the middle of the screen caused by the IR drop can be prevented. The power lines described in this embodiment are to supply a constant voltage and/or a constant current. For example, they can be not only power lines for supplying a current to be used to light the OLED elements but also reference voltage supply lines.

Figure 6A:
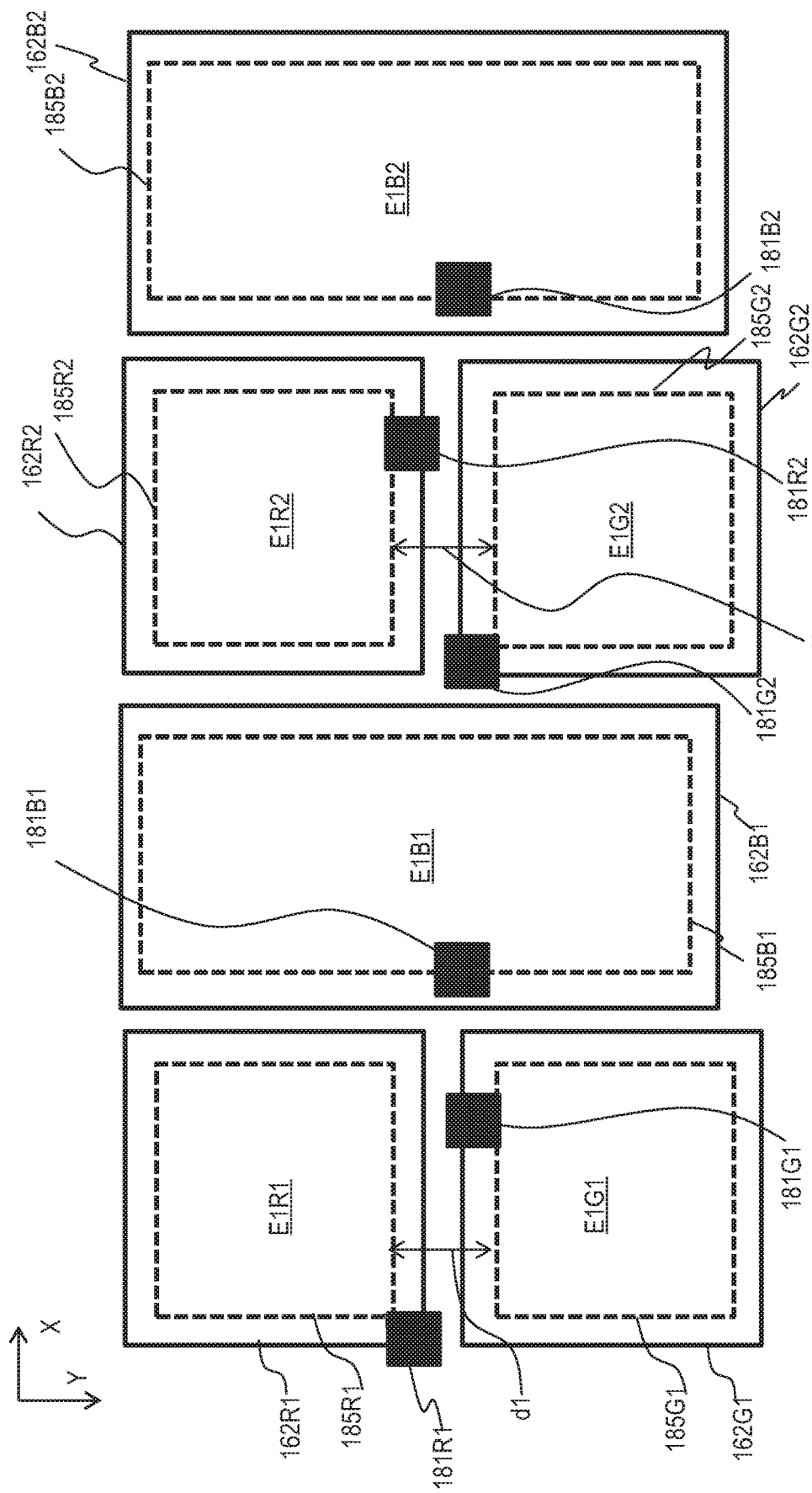
FIG. 6A is a plan diagram for illustrating another layout of OLED elements of this disclosure.
Figure 6B:
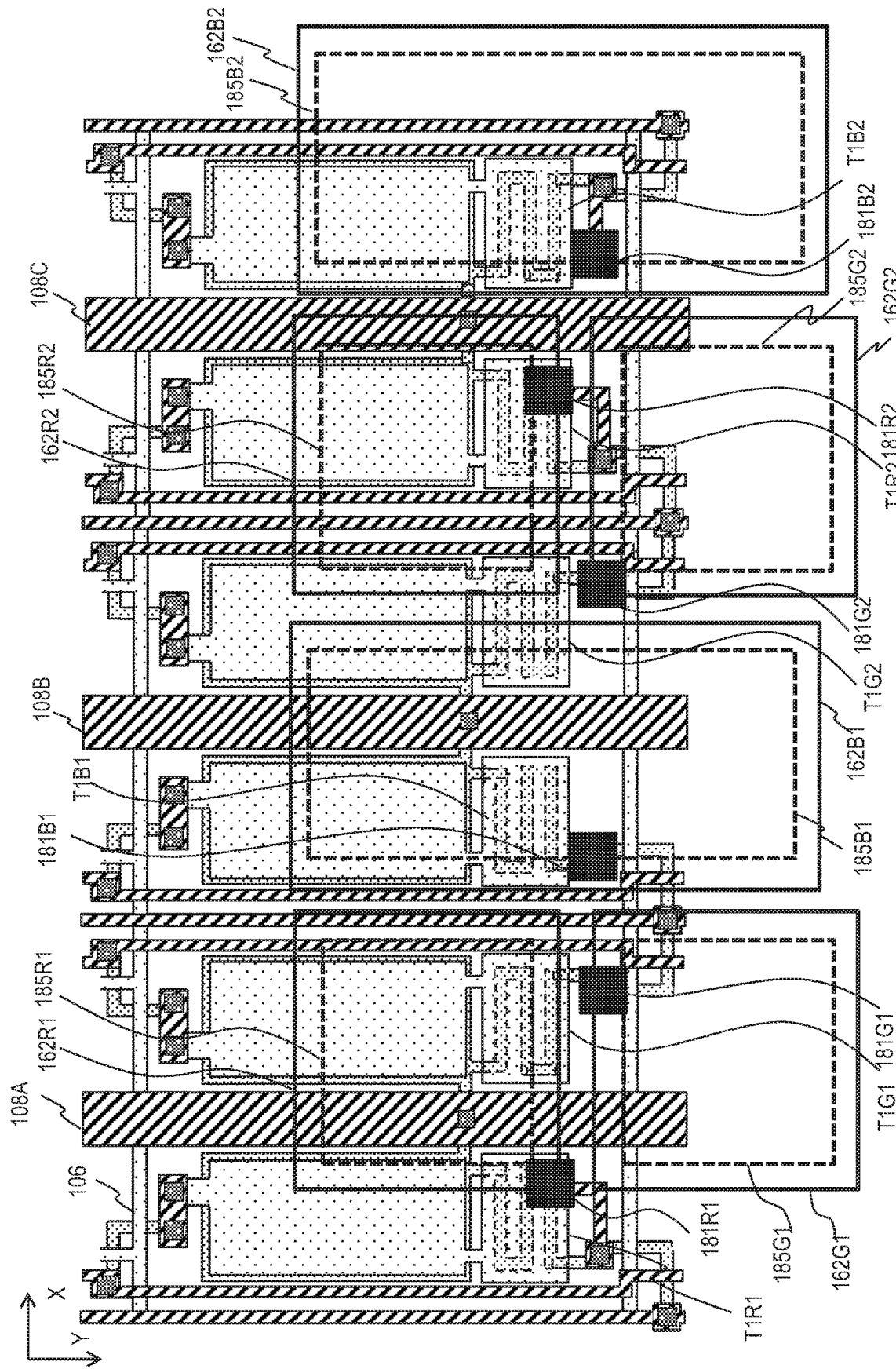
FIG. 6B is a plan diagram for illustrating the other layout of OLED elements of this disclosure together with the layout of pixel circuits for controlling driving of the OLED elements.

Another example of the layout of pixel circuits and OLED elements of this disclosure is described with reference to FIGS. 6A and 6B. FIG. 6A is a plan diagram for illustrating the layout of OLED elements of this example. FIG. 6B is a plan diagram for illustrating the layout of OLED elements of this example together with the layout of pixel circuits for controlling driving of the OLED elements.

FIG. 6A illustrates six OLED elements. FIG. 6A shows the anode electrodes and the light-emitting regions of the OLED elements. The OLED elements E1R1 and E1G1 are adjacent to each other along the Y-axis. In the example of FIG. 6A, the OLED element E1R1 is disposed above the OLED element E1G1. The OLED element E1B1 is adjacent to the OLED elements E1R1 and E1G1 along the X-axis. In the example of FIG. 6A, the OLED element E1B1 is disposed on the right of the OLED elements E1R1 and E1G1.

The OLED elements E1R2 and E1G2 are adjacent to the OLED element E1B1 along the X-axis. The OLED elements E1R2 and E1G2 are disposed on the right of the OLED element E1B1. The OLED elements E1R2 and E1G2 are adjacent to each other along the Y-axis.

In the example of FIG. 6A, the OLED element E1R2 is disposed above the OLED element E1G2. The OLED element E1B2 is adjacent to the OLED elements E1R2 and E1G2 along the X-axis. In the example of FIG. 6A, the OLED element E1B2 is disposed on the right of the OLED elements E1R2 and E1G2.

A red OLED element, a green OLED element, and a blue OLED element (the light-emitting regions thereof) adjacent to one another constitute one main pixel. FIG. 6A illustrates OLED elements corresponding to two main pixels in a main pixel row. The OLED elements are disposed in the same manner in the other rows. In other words, blue OLED elements (subpixels) are successively disposed along the Y-axis and red and green OLED elements (subpixels) are alternately disposed along the Y-axis.

The OLED element E1R1 includes an anode electrode 162R1 and a light-emitting region 185R1. The OLED element E1G1 includes an anode electrode 162G1 and a light-emitting region 185G1. The OLED element E1B1 includes an anode electrode 162B1 and a light-emitting region 185B1. The OLED element E1R2 includes an anode electrode 162R2 and a light-emitting region 185R2. The OLED element E1G2 includes an anode electrode 162G2 and a light-emitting region 185G2. The OLED element E1B2 includes an anode electrode 162B2 and a light-emitting region 185B2.

The light-emitting region of each OLED element is included in the region of the anode electrode, when viewed planarly. In FIG. 6A, the red light-emitting regions and the green light-emitting regions have identical shapes and the blue light-emitting regions are larger than the red and green light-emitting regions. The shapes of the light-emitting regions of each color depend on the design.

The anode electrodes 162R1, 162G1, 162B1, 162R2, 162G2, and 162B2 are connected with driving transistors through contact holes 181R1, 181G1, 181B1, 181R2, 181G2, and 181B2, respectively. In the example of FIG. 6A, the anode electrodes 162R1, 162R2, 162G1, and 162G2 have identical rectangular shapes. The anode electrodes 162B1 and 162B2 have identical rectangular shapes and they are larger than the anode electrodes 162R1, 162R2, 162G1, and 161G2.

In the example of FIG. 6A, the top ends of the anode electrodes 162R1, 162R2, 162B1, and 162B2 are located at the same position in the Y-axis. The bottom ends of the anode electrodes 162B1 and 162B2 are located between the top ends and the bottom ends of the anode electrodes 162G1 and 162G2 in the Y-axis.

FIG. 6B illustrates another example of the layout of pixel circuits and OLED elements of this disclosure. Hereinafter, positional relations among OLED elements, driving transistors, and power lines are mainly described. FIG. 6B shows a selection transistor, a storage capacitor, and a driving transistor in each pixel circuit. The configurations of the selection transistor and the storage capacitor are substantially the same as those described with reference to FIGS. 5A to 5C; detailed description is omitted here.

FIG. 6B illustrates six pixel circuits disposed along the X-axis. The pixel circuits are, in order from the left to the right, to control driving of the OLED elements E1R1, E1G1, E1B1, E1G2, E1R2, and E1B2 in FIG. 6A. FIG. 6B shows only partial configurations of the pixel circuits. A power line 108A extends along the Y-axis between the pixel circuits for the OLED elements E1R1 and E1G1. A power line 108B extends along the Y-axis between the pixel circuits for the OLED elements E1B1 and E1G2. A power line 108C extends along the Y-axis between the pixel circuits for the OLED elements E1R2 and E1B2.

The anode electrodes 162R1, 162G1, 162B1, 162R2, 162G2, and 162B2 are connected with the driving transistors T1R1, T1G1, T1B1, T1R2, T1G2, and T1B2 through contact holes 181R1, 181G1, 181B1, 181R2, 181G2, and 181B2, respectively.

Each anode electrode overlaps two pixel circuits on different sides with respect to a power line, when viewed planarly. Specifically, the anode electrode 162R1 overlaps the power line 108A and the pixel circuits on both sides thereof, when viewed planarly. The pixel circuit on the left of the power line 108A is the pixel circuit for the OLED element E1R1 and the pixel circuit on the right of the power line 108A is the pixel circuit for the OLED element E1G1. The anode electrode 162R1 is connected with the pixel circuit on the left. The anode electrode 162G1 overlaps the power line 108A and the pixel circuits on both sides thereof, when viewed planarly. The anode electrode 162G1 is connected with the pixel circuit on the right.

The anode electrode 162B1 overlaps the power line 108B and the pixel circuits on both sides thereof, when viewed planarly. The pixel circuit on the left of the power line 108B is the pixel circuit for the OLED element E1B1 and the pixel circuit on the right of the power line 108B is the pixel circuit for the OLED element E1G2. The anode electrode 162B1 is connected with the pixel circuit on the left.

The anode electrode 162R2 overlaps both pixel circuits between the power lines 108B and 108C, when viewed planarly. The pixel circuit on the left is the pixel circuit for the OLED element E1G2 and the pixel circuit on the right is the pixel circuit for the OLED element E1R2. The anode electrode 162R2 is connected with the pixel circuit on the right. The anode electrode 162G2 overlaps both of the pixel circuits between the power lines 108B and 108C, when viewed planarly. The anode electrode 162G2 is connected with the pixel circuit on the left.

The anode electrode 162B2 overlaps both pixel circuits between the power line 108C and the next power line on the right (not shown), when viewed planarly. The anode electrode 162B2 is connected with the pixel circuit on the left.

Next, disposition of the contact holes is described. The contact hole 181R1 is located outside the light-emitting region 185R1 of the OLED element E1R1. At least a part of the boundary of the contact hole 181R1 is shared by the boundary of the light-emitting region 185R1 of the OLED element E1R1 (at the lower left corner). The contact hole 181G1 is located outside the light-emitting region 185G1 of the OLED element E1G1. At least a part of the boundary of the contact hole 181G1 is shared by the boundary of the light-emitting region 185G1 of the OLED element E1G1 (at an upper right part).

In this regard, if a contact hole is disposed within a light-emitting region, the organic layer such as the light-emitting layer and the cathode electrode are dent along this contact hole. This means that the organic layer functioning as an insulating layer partially becomes thin. As a result, the anode electrode and the cathode electrode easily get short-circuited to increase the possibility of a point defect of a pixel. In this embodiment, however, the contact holes for the red and green OLED elements are disposed in the non-light-emitting region and therefore, a point defect of a pixel is prevented.

The layout illustrated in FIGS. 6A and 6B allows the light-emitting regions (organic light-emitting films) of the same color to be located more distant from one another than the layout described with reference to FIGS. 5A to 5C. For this reason, the main pixels of the OLED display device fabricated using metal masks can have larger light-emitting regions.

Like the example described with reference to FIGS. 5B and 5C, sharing one power line between two pixel circuits leads to reduction in wiring space and increase in circuit density. The driving transistors T1R1 and T1R2 for red OLED elements are disposed on the left of the power lines 108A and 108C, respectively.

The driving transistors T1G1 and T1G2 for green OLED elements are disposed on the right of the power lines 108A and 108B, respectively. For this reason, even if misalignment occurs along the X-axis, namely toward either the right or the left of FIG. 6C, differences in luminance between the red subpixels and between the green subpixels can be eliminated.

As to the blue subpixels, however, misalignment could cause a difference in characteristics between the driving transistors and generate a difference in luminance. However, green has the highest relative visibility and blue has the lowest. Accordingly, elimination of the differences in luminance between the red subpixels and between the green subpixels minimizes the impairment of the display quality. Alternatively, a color combination of red and blue or green and blue can be selected to dispose each pair of driving transistors of the same color on the same side with respect to the power line connected therewith. Any one of these layouts reduces the impairment of display quality caused by misalignment, compared to the comparative example described with reference to FIGS. 4A to 4C.

Figure 6C:
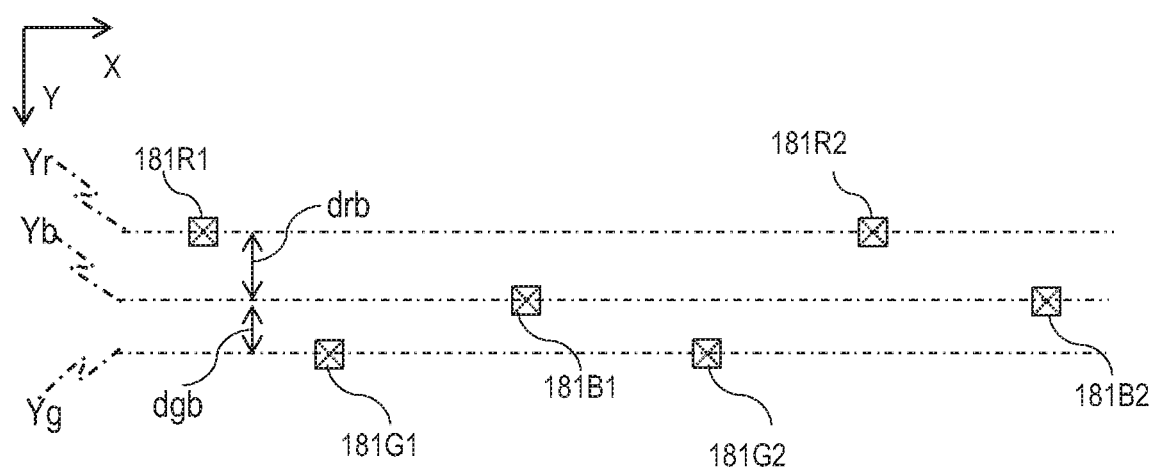
FIG. 6C is a diagram for illustrating the locations of a plurality of contact holes with respect to the X-axis and the Y-axis.

Next, the locations of the contact holes in the layout of pixel circuits and OLED elements described with FIGS. 6A and 6B are described in detail with reference to FIGS. 6A and 6B and further, FIG. 6C. FIG. 6C is a diagram for illustrating the locations of the contact holes with respect to the X-axis and the Y-axis.

First, the positional relation with respect to the Y-axis among the contact holes is described with reference to FIG. 6C. In FIG. 6C, the dotted-and-dashed lines denoted by the reference signs Yr, Yb, and Yg are parallel to the X-axis and schematically represent coordinates on the Y-axis. The coordinate Yr is the Y-coordinate of the first contact hole 181R1 and the fifth contact hole 181R2 for the red OLED elements. The positions in the Y-axis of the first contact hole 181R1 and the fifth contact hole 181R2 are the same.

The coordinate Yg is the Y-coordinate of the second contact hole 181G1 and the fourth contact hole 181G2 for the green OLED elements. The positions in the Y-axis of the second contact hole 181G1 and the fourth contact hole 181G2 are the same.

The coordinate Yb is the Y-coordinate of the third contact hole 181B1 and the sixth contact hole 181B2 for the blue OLED elements. The positions in the Y-axis of the third contact hole 181B1 and the sixth contact hole 181B2 are the same.

The position in the Y-axis of the third contact hole 181B1 is different from those of the first and the second contact holes 181R1 and 181G1. The position of the first contact hole 181R1 is distant from the position of the third contact hole 181B1 in a first direction along the Y-axis. The first direction is opposite to the direction of the arrow of the Y-axis and directed upward in FIG. 6C. The position of the second contact hole 181G1 is distant from the position of the third contact hole 181B1 in a second direction along the Y-axis that is opposite to the first direction. The second direction is the direction of the arrow of the Y-axis and directed downward in FIG. 6C.

The distance drb along the Y-axis between the centroid of the first contact hole 181R1 and the centroid of the third contact hole 181B1 is longer than the distance dgb along the Y-axis between the centroid of the second contact hole 181G1 and the centroid of the third contact hole 181B1.

Next, positional relations of the contact holes to the light-emitting regions are described with reference to FIGS. 6A and 6C. The isolation distance along the Y-axis between a red OLED element and a green OLED element is longer than the distance between the contact hole for the red OLED element and the contact hole for the green OLED element. Specifically, as illustrated in FIG. 6A, the distance d1 along the Y-axis between the boundary along the X-axis of the light-emitting region 185R1 of the OLED element E1R1 and the boundary along the X-axis of the light-emitting region 185G1 of the OLED element E1G1 is longer than the distance between the centroid of the first contact hole 181R1 and the centroid of the second contact hole 181G1 (see the distance drb+dgb in FIG. 6C).

Further, the distance d1 along the Y-axis between the boundary along the X-axis of the light-emitting region 185R1 of the OLED element E1R1 and the boundary along the X-axis of the light-emitting region 185G1 of the OLED element E1G1 is equal to the distance d2 along the Y-axis between the boundary along the X-axis of the light-emitting region 185R2 of the OLED element E1R2 and the boundary along the X-axis of the light-emitting region 185G2 of the OLED element E1G2.

Next, the positional relation with respect to the X-axis among the contact holes are described with reference to FIG. 6A. As illustrated in FIG. 6A, the positions in the X-axis of the contact holes for the red and green OLED elements in a first main-pixel column (for example, an odd-numbered main-pixel column) are different from those of the contact holes for the red and green OLED elements in a second main-pixel column (for example, an even-numbered main-pixel column).

Specifically, the position of the first contact hole 181R1 is distant from the position of the centroid of the light-emitting region E1R1 or the light-emitting region E1G1 in a third direction along the X-axis. The third direction is opposite to the direction of the arrow of the X-axis and directed leftward in FIG. 6C. The position of the second contact hole 181G1 is distant from the position of the centroid of the light-emitting region E1R1 or the light-emitting region E1G1 in a fourth direction along the X-axis that is opposite to the third direction. The fourth direction is directed rightward in FIG. 6C.

The position of the fifth contact hole 181R2 is distant from the position of the centroid of the light-emitting region E1R2 or the light-emitting region E1G2 in the fourth direction along the X-axis. The position of the fourth contact hole 181G2 is distant from the position of the centroid of the light-emitting region E1R2 or the light-emitting region E1G2 in the third direction along the X-axis.

The above-described disposition of the contact holes eliminates differences in characteristics between the driving transistors for the OLED elements of the same color (pixel circuits because of differences in capacitance distribution) caused by misalignment to the lithography device and the resulting differences in luminance between the red subpixels and between the green subpixels without changing the shapes of the lower electrodes (anode electrodes). Since the anode electrodes can have the same shape, the light-emitting regions do not need to be adjusted in shape or position; the complexity in designing the layout can be reduced.

Figure 7:
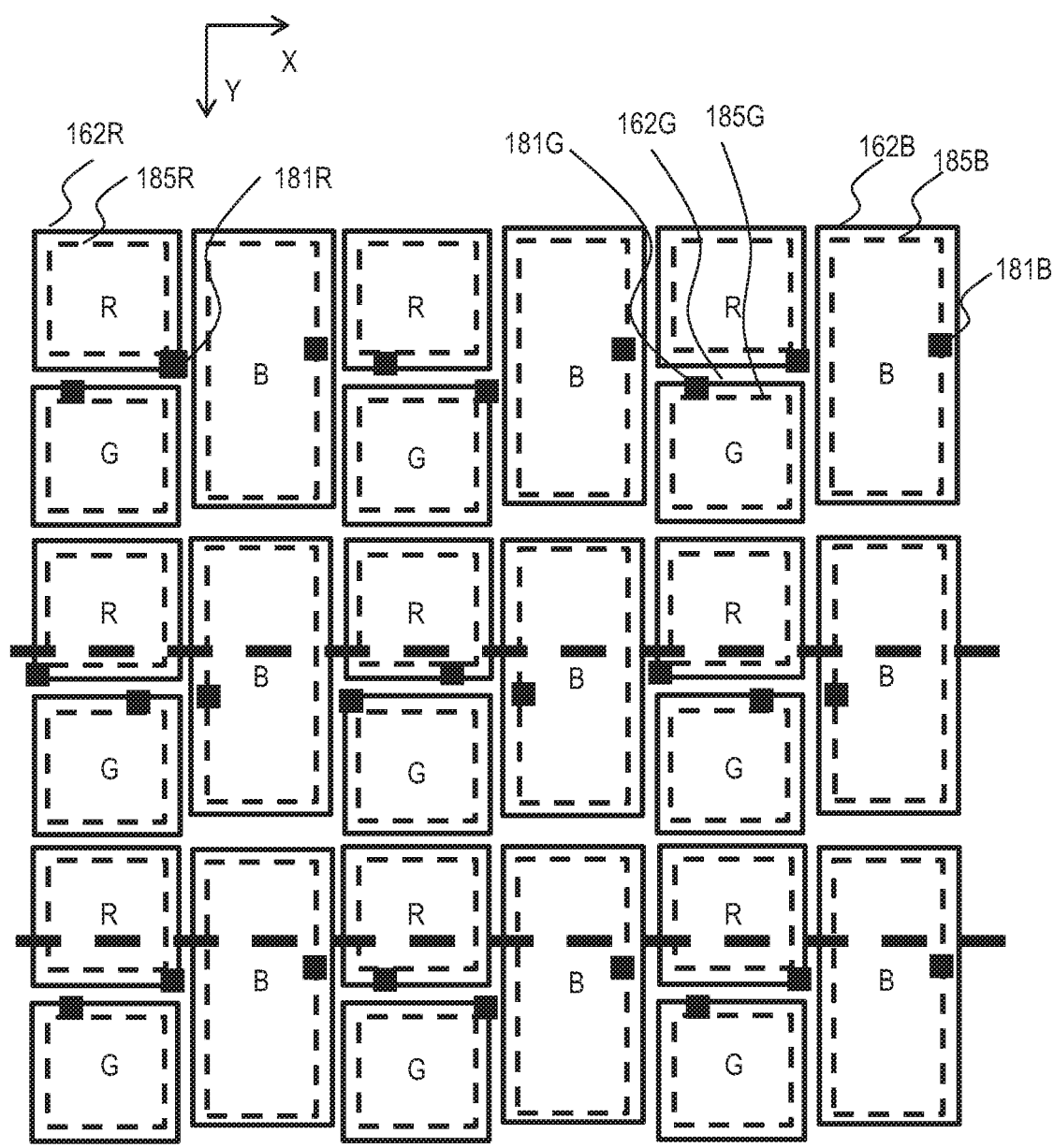
FIG. 7 illustrates a layout of OLED elements according to the configuration described with reference to FIGS. 6A and 6B.
Figure 8:
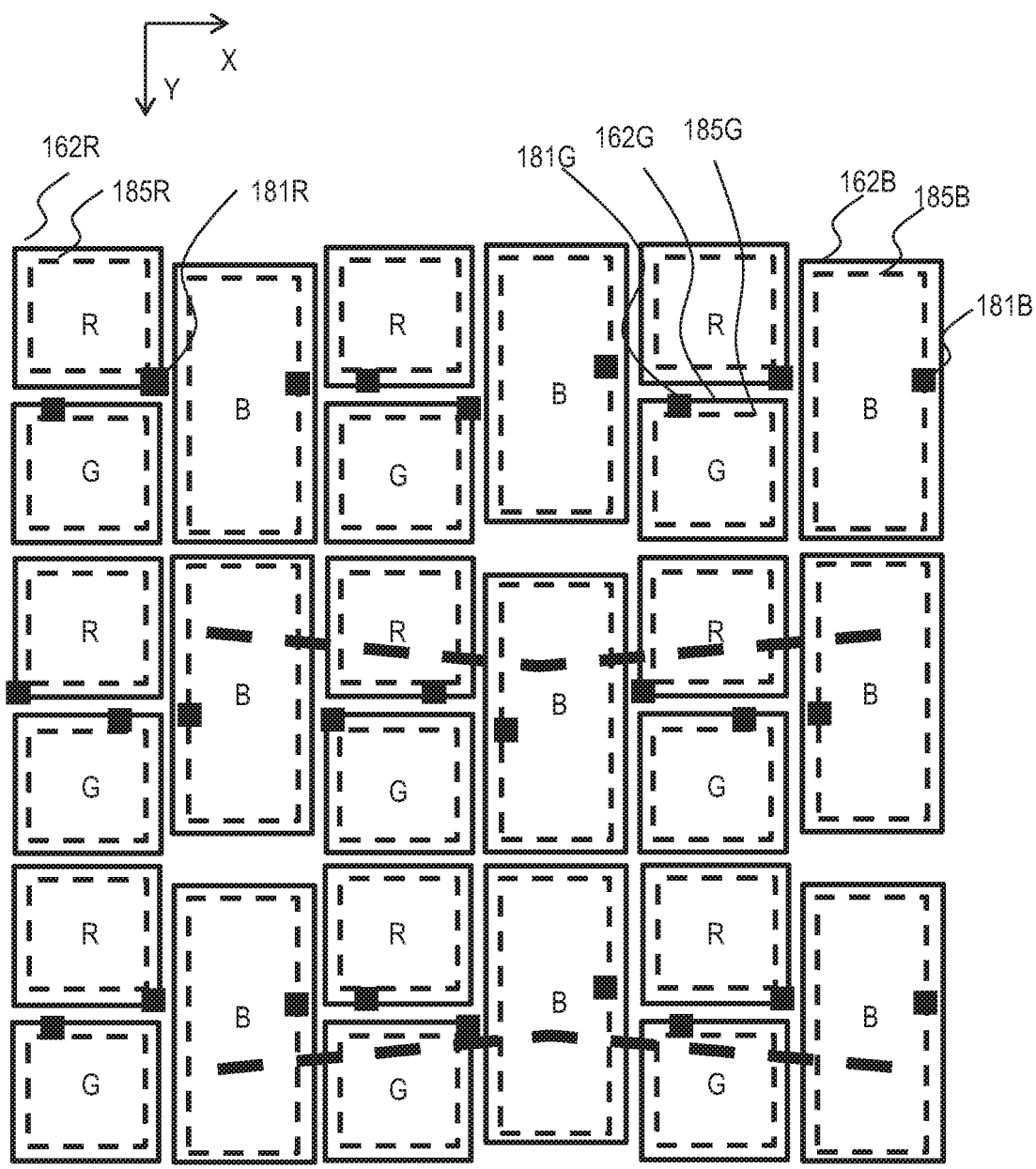
FIG. 8 illustrates another layout of OLED elements.

Examples of the layout of OLED elements are described. FIG. 7 illustrates the layout of OLED elements according to the configuration described with reference to FIGS. 6A and 6B. FIG. 8 illustrates another layout of OLED elements. The pixel circuit layout illustrated in FIGS. 6B and 6C is applicable to both of the OLED element layouts in FIGS. 7 and 8.

With reference to FIGS. 7 and 8, each red OLED element includes an anode electrode 162R and a light-emitting region 185R. The anode electrode 162R is connected with a driving transistor (not shown in FIGS. 7 and 8) through a contact hole 181R. Each green OLED element includes an anode electrode 162G and a light-emitting region 185G. The anode electrode 162G is connected with a driving transistor (not shown in FIGS. 7 and 8) through a contact hole 181G.

Each blue OLED element includes an anode electrode 162B and a light-emitting region 185B. The anode electrode 162B is connected with a driving transistor (not shown in FIGS. 7 and 8) through a contact hole 181B. In FIG. 7, only one of the red OLED elements, one of the green OLED elements, and one of the blue OLED elements are provided with reference signs by way of example.

FIG. 7 illustrates three rows by three columns of main pixels. A red OLED element and a green OLED element vertically adjacent to each other and a blue OLED element on the right of these OLED elements correspond to one main pixel. In the layout of FIG. 7, the upper ends of the anode electrodes 162B for blue OLED elements are flush with the upper ends of the anode electrodes 162R for red OLED elements in each main pixel row. In each main pixel row, the centroids of the blue light-emitting regions 185B are on a straight line.

FIG. 8 illustrates three rows by three columns of main pixels.

Compared to the layout in FIG. 7, the blue light-emitting regions 185B (the anode electrodes 162B of blue OLED elements) are staggered in each main pixel row. In other words, the centroids of the blue light-emitting regions 185B are on a zigzag line. The centroids of the blue light-emitting regions 185B in an odd-numbered row are located symmetrically with the centroids of the blue light-emitting regions 185B in an even-numbered row with respect to the X-axis. This layout averages the effects of color edges to achieve good color mixture.

Connection of Data Lines with Driver IC

Figure 9A:
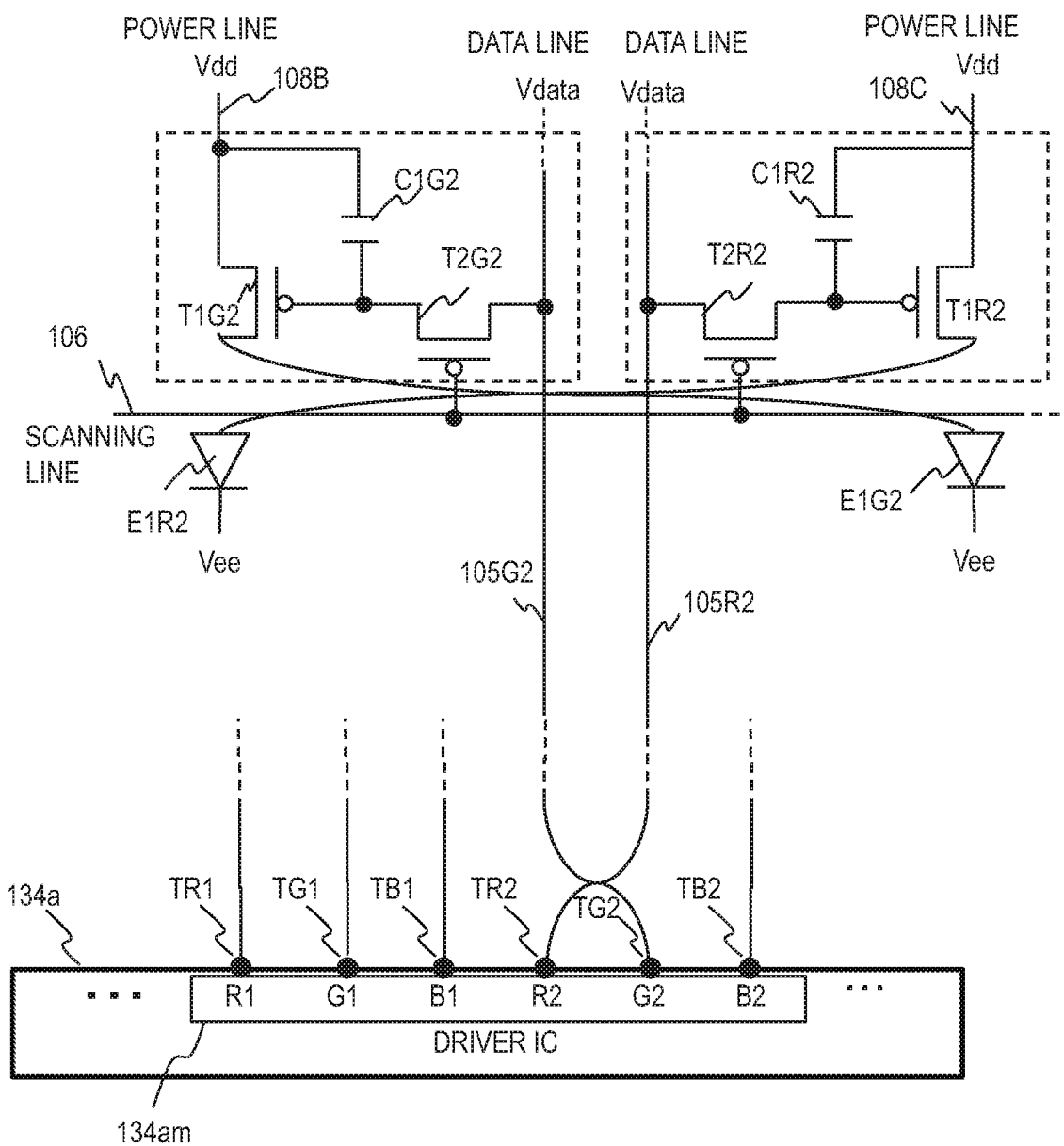
FIG. 9A illustrates an example of connection of a driver IC and data lines.

FIG. 9A illustrates an example of connection of a driver IC 134a and data lines 105. The driver IC 134a is an example of the driver IC 134 in FIG. 1. The driver IC 134a includes a memory 134am for temporarily storing control signals to be output to data lines. The driver IC 134a includes terminals TR1, TG1, TB1, TR2, TG2, and TB2. The terminals are also called output pins.

The reference signs R1 and R2 in the memory 134am represent the picture data values (hereinafter, also referred to as data values as appropriate) to be output to the data line for the OLED element E1R1 and the data line 105R2 for the OLED element E1R2. The data values are also referred to as control signals. The terminals TR1 and TR2 are connected with the data line for the OLED element E1R1 and the data line 105R2 for the OLED element E1R2, respectively. The driver IC 134a outputs the data values R1 and R2 stored in the memory 134am to the terminals TR1 and TR2, respectively.

The reference signs G1 and G2 in the memory 134am represent the data values to be output to the data line for the OLED element E1G1 and the data line 105G2 for the OLED element E1G2. The terminals TG1 and TG2 are connected with the data line for the OLED element E1G1 and the data line 105G2 for the OLED element E1G2, respectively. The driver IC 134a outputs the data values G1 and G2 stored in the memory 134am to the terminals TG1 and TG2, respectively.

The reference signs B1 and B2 in the memory 134am represent the data values to be output to the data line for the OLED element E1B1 and the data line for the OLED element E1B2. The terminals TB1 and TB2 are connected with the data line for the OLED element E1B1 and the data line for the OLED element E1B2, respectively. The driver IC 134a outputs the data values B1 and B2 stored in the memory 134am to the terminals TB1 and TB2, respectively.

In the pixel circuit layouts described with reference to FIGS. 5C and 6C, the order of the OLED elements E1R2 and E1G2 is opposite to the order of the pixel circuits for the OLED elements E1R2 and E1G2. In the connection example illustrated in FIG. 9A, the disposition of the terminals of the driver IC 134a is the same as the disposition of the OLED elements E1.

The data line 105R2 for the red OLED element E1R2 and the data line 105G2 for the green OLED element E1G2 are connected with the associated terminals TR2 and TG2 of the driver IC 134a and cross each other before reaching the OLED elements E1R2 and E1G2. A typical driver IC stores the picture data value for a red subpixel, the picture data value for a green subpixel, and the picture data value for a blue subpixel included in received picture data to the memory in this order as illustrated in FIG. 9A.

In the example of FIG. 9A, the data line 105R2 and the data line 105G2 cross each other. Accordingly, even though the order of the red OLED element E1R2 and the green OLED element E1G2 is opposite to the order of the pixel circuits therefor, the driver IC 134a can store the data values for individual colors of subpixels to the memory 134am without changing the order of the data values for individual colors of subpixels. Hence, the driver IC 134a can provide appropriate data values to the pixel circuits. The configuration illustrated in FIG. 9A enables utilization of an existing driver IC without development of a special driver IC for the display panels described in the foregoing embodiments.

Unlike the example illustrated in FIG. 9A, the data values stored in the memory of the driver IC can be rearranged.

Figure 9B:
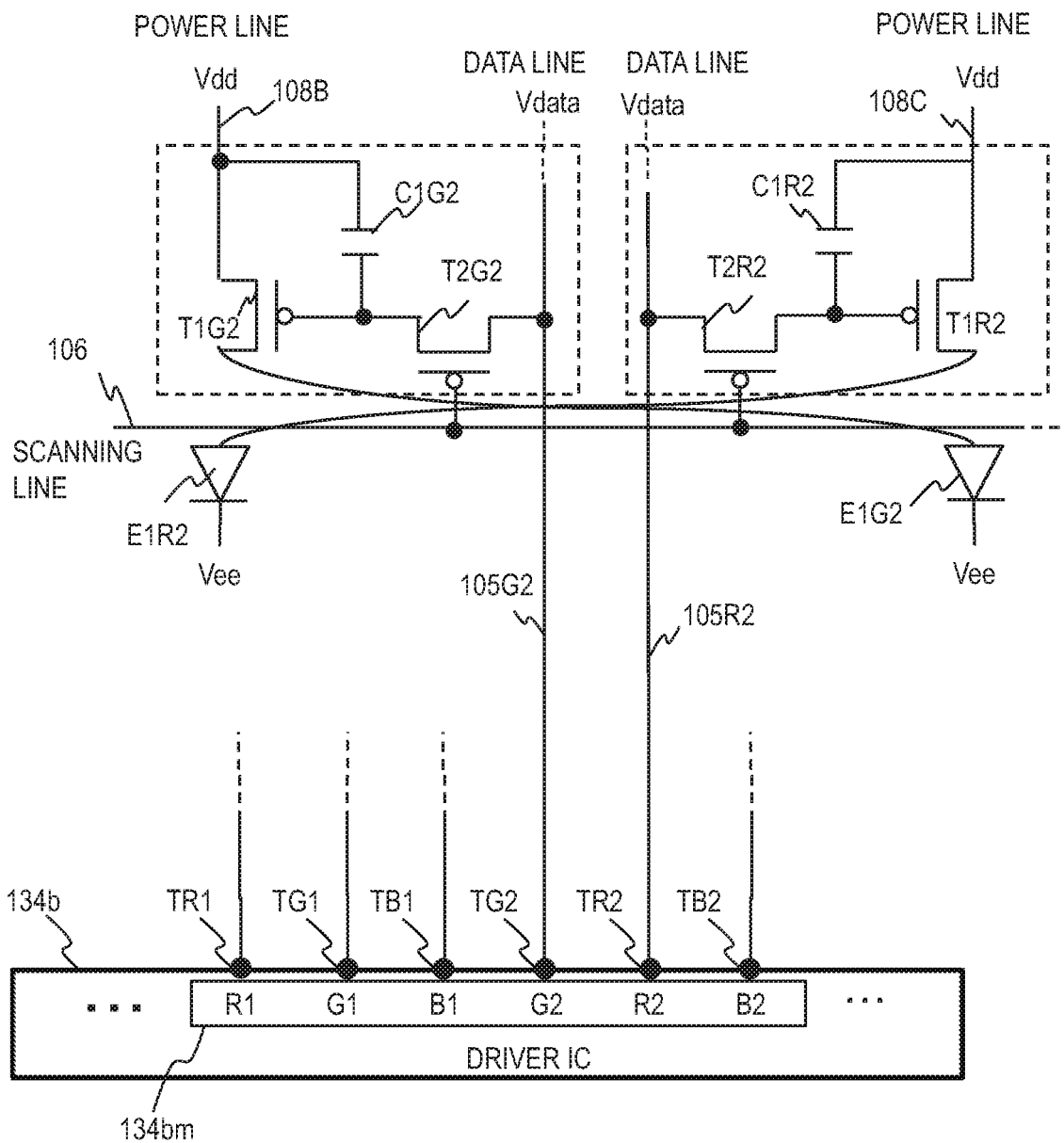
FIG. 9B illustrates another example of connection of a driver IC and data lines.

FIG. 9B illustrates another example of connection of a driver IC 134b and data lines 105. FIG. 9B schematically illustrates the terminals and the data lines connected therewith in the case where the order of data values stored in the memory 134bm of the driver IC 134b is changed. Hereinafter, differences from FIG. 9A are described. The data lines 105R2 and 105G2 reach the OLED elements E1R2 and E1G2 without crossing. Since the data lines do not cross, the terminals TG2 and TR2 are disposed in this order.

Since there is no crossing described above, the driver IC 134b stores the data values G2 and R2 to the memory 134bm in this order to meet the order of disposition of the lines 105G2 and 105R2. That is to say, in the example of FIG. 9B, the order of storing the data values G2 and R2 is different from the one in the example of FIG. 9A. Because of no crossing of data lines, the example of FIG. 9B eliminates the risk of a short circuit that could occur between crossing lines to achieve higher yield in manufacturing a display device. Further, a simple design is available by avoiding the complexity because of the crossing to achieve a smaller man-hour.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
    a plurality of power lines disposed to extend along a first axis and to be distant from one another along a second axis;
    a plurality of first driving transistors, each of which is disposed on a first side along the second axis of respective one of the plurality of power lines and provided with a power-supply potential from the respective power line;
    a plurality of second driving transistors, each of which is disposed on a second side along the second axis of respective one of the plurality of power lines and provided with a power-supply potential from the respective power line; and
    a plurality of light-emitting elements of a first color, a plurality of light-emitting elements of a second color, and a plurality of light-emitting elements of a third color,
    wherein the plurality of power lines include a plurality of power line units disposed along the second axis,
    wherein each of the plurality of power line units consists of a first power line, a second power line adjacent to the first power line, and a third power line adjacent to the second power line,
    wherein a first driving transistor of the first power line drives a first light-emitting element of the first color,
    wherein a second driving transistor of the first power line drives a first light-emitting element of the second color,
    wherein a first driving transistor of the second power line drives a first light-emitting element of the third color,
    wherein a second driving transistor of the second power line drives a second light-emitting element of the second color,
    wherein a first driving transistor of the third power line drives a second light-emitting element of the first color, wherein a second driving transistor of the third power line drives a second light-emitting element of the third color, and wherein the first light-emitting element of the first color, the first light-emitting element of the second color, the first light-emitting element of the third color, the second light-emitting element of the first color, the second light-emitting element of the second color, and the second light-emitting element of the third color are disposed in this order in a line along the second axis.

2. The display device according to claim 1, wherein a pattern of the first driving transistor of each power line and a pattern of the second driving transistor of the power line are symmetric with respect to the power line.

3. The display device according to claim 2, wherein the pattern of the first driving transistor of each power line is adjacent to the pattern of the second driving transistor of the power line.

4. The display device according to claim 1, wherein the plurality of first driving transistors are opposed to the plurality of second driving transistors along the second axis, wherein a lower electrode of the second light emitting element of the first color has a first arm extending toward the third power line on a first end along the first axis, wherein a lower electrode of the second light emitting element of the second color has a second arm extending toward the second power line on a second end along the first axis, wherein a first driving transistor of the third power line is connected with the first arm through a contact hole provided in the first arm, and wherein a second driving transistor of the second power line is connected with the second arm through a contact hole provided in the second arm.

5. The display device according to claim 1, further comprising:

a plurality of data lines configured to transmit control signals for the plurality of first driving transistors and the plurality of second driving transistors; and a driver circuit configured to provide the control signals to the plurality of data lines, wherein a data line configured to transmit a control signal for the second driving transistor of the second power line and a data line configured to transmit a control signal for the first driving transistor of the third power line cross each other.

6. The display device according to claim 1, further comprising:

a plurality of data lines configured to transmit control signals for the plurality of first driving transistors and the plurality of second driving transistors; and a driver circuit configured to provide the control signals to the plurality of data lines, wherein a data line configured to transmit a control signal for the second driving transistor of the second power line and a data line configured to transmit a control signal for the first driving transistor of the third power line do not cross each other.

7. A display device comprising:

a plurality of power lines disposed to extend along a first axis and to be distant from one another along a second axis;

a plurality of first driving transistors, each of which is disposed on a first side along the second axis of respective one of the plurality of power lines and provided with a power-supply potential from the respective power line;

a plurality of second driving transistors, each of which is disposed on a second side along the second axis of respective one of the plurality of power lines and provided with a power-supply potential from the respective power line; and a plurality of light-emitting elements of a first color, a plurality of light-emitting elements of a second color, and a plurality of light-emitting elements of a third color, wherein the plurality of power lines include a plurality of power line units disposed along the second axis, wherein each of the plurality of power line units consists of a first power line, a second power line adjacent to the first power line, and a third power line adjacent to the second power line, wherein a first driving transistor of the first power line drives a first light-emitting element of the first color, wherein a second driving transistor of the first power line drives a first light-emitting element of the second color, wherein a first driving transistor of the second power line drives a first light-emitting element of the third color, wherein a second driving transistor of the second power line drives a second light-emitting element of the second color, wherein a first driving transistor of the third power line drives a second light-emitting element of the first color, wherein a second driving transistor of the third power line drives a second light-emitting element of the third color, wherein the first light-emitting element of the first color is adjacent to the first light-emitting element of the second color along the first axis, wherein the first light-emitting element of the third color is adjacent to the first light-emitting element of the first color and the first light-emitting of the second color along the second axis, wherein the second light-emitting element of the first color and the second light-emitting element of the second color are adjacent to each other along the first axis and adjacent to the first light emitting element of the third color along the second axis, and wherein the second light-emitting element of the third color is adjacent to the second light-emitting element of the first color and the second light-emitting element of the second color along the second axis.

8. The display device according to claim 7, wherein the first light-emitting element of the first color has a first contact hole connecting to the first driving transistor of the first power line in a lower electrode thereof, wherein the first light-emitting element of the second color has a second contact hole connecting to the second driving transistor of the first power line in a lower electrode thereof, wherein the first light-emitting element of the third color has a third contact hole connecting to the first driving transistor of the second power line in a lower electrode thereof, and wherein, with respect to the first axis, the third contact hole is located at a position different from positions of the first and the second contact holes.

9. The display device according to claim 8,
wherein the position of the first contact hole is distant from the position of the third contact hole in a first direction along the first axis, and
wherein the position of the second contact hole is distant from the position of the third contact hole in a second direction along the first axis that is opposite to the first direction.

10. The display device according to claim 9, wherein a distance along the first axis between the centroid of the first contact hole and the centroid of the third contact hole is longer than a distance along the first axis between the centroid of the second contact hole and the centroid of the third contact hole.

11. The display device according to claim 8, wherein a distance along the first axis between the boundary along the second axis of a light-emitting region of the first light-emitting element of the first color and the boundary along the second axis of a light-emitting region of the first light-emitting element of the second color is longer than a distance along the first axis between the centroid of the first contact hole and the centroid of the second contact hole.

12. The display device according to claim 9,
wherein the second light-emitting element of the second color has a fourth contact hole connecting to the second driving transistor of the second power line in a lower electrode thereof,
wherein the second light-emitting element of the first color has a fifth contact hole connecting to the first driving transistor of the third power line in a lower electrode thereof,
wherein, with respect to the first axis, the first contact hole and the fifth contact hole are located at the same position, and
wherein, with respect to the first axis, the second contact hole and the fourth contact hole are located at the same position.

13. The display device according to claim 12,
wherein the first contact hole is distant from the centroid of a light-emitting region of the first light-emitting element of the first color in a third direction along the second axis,
wherein the second contact hole is distant from the centroid of a light-emitting region of the first light-emitting element of the second color in a fourth direction along the second axis that is opposite to the third direction,
wherein the fourth contact hole is distant from the centroid of a light-emitting region of the second light-emitting element of the second color in the third direction along the second axis, and wherein the fifth contact hole is distant from the centroid of a light-emitting region of the second light-emitting element of the first color in the fourth direction along the second axis.

14. The display device according to claim 8,
wherein the first contact hole is located outside a light-emitting region of the first light-emitting element of the first color, and
wherein the second contact hole is located outside a light-emitting region of the first light-emitting element of the second color.

15. The display device according to claim 14,
wherein at least a part of the boundary of the first contact hole is shared by the boundary of the light-emitting region of the first light-emitting element of the first color, and
wherein at least a part of the boundary of the second contact hole is shared by the boundary of the light-emitting region of the first light-emitting element of the second color.

16. The display device according to claim 7, wherein a pattern of the first driving transistor of each power line and a pattern of the second driving transistor of the power line are symmetric with respect to the power line.

17. The display device according to claim 16, wherein the pattern of the first driving transistor of each power line is adjacent to the pattern of the second driving transistor of the power line.

18. The display device according to claim 7, further comprising:
a plurality of data lines configured to transmit control signals for the plurality of first driving transistors and the plurality of second driving transistors; and
a driver circuit configured to provide the control signals to the plurality of data lines,
wherein a data line configured to transmit a control signal for the second driving transistor of the second power line and a data line configured to transmit a control signal for the first driving transistor of the third power line cross each other.

19. The display device according to claim 7, further comprising:
a plurality of data lines configured to transmit control signals for the plurality of first driving transistors and the plurality of second driving transistors; and
a driver circuit configured to provide the control signals to the plurality of data lines,
wherein a data line configured to transmit a control signal for the second driving transistor of the second power line and a data line configured to transmit a control signal for the first driving transistor of the third power line do not cross each other.

* * * * *